(12) United States Patent
Parulkar

(10) Patent No.: US 6,769,081 B1
(45) Date of Patent: Jul. 27, 2004

(54) RECONFIGURABLE BUILT-IN SELF-TEST ENGINE FOR TESTING A RECONFIGURABLE MEMORY

(75) Inventor: Ishwardutt Parulkar, San Francisco, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 584 days.

(21) Appl. No.: 09/651,359

(22) Filed: Aug. 30, 2000

(51) Int. Cl.$^7$ ............................................... G01R 31/28

(52) U.S. Cl. ........................................................ 714/733

(58) Field of Search ........................... 714/7, 30, 733; 365/201

(56) References Cited

U.S. PATENT DOCUMENTS

| | | | |
|---|---|---|---|
| 5,604,756 A | | 2/1997 | Kawata ...................... 714/733 |
| 5,720,031 A | | 2/1998 | Lindsay ........................ 714/42 |
| 5,809,036 A | | 9/1998 | Champlin .................... 714/726 |
| 5,982,681 A | * | 11/1999 | Schwarz ...................... 365/201 |
| 6,012,157 A | | 1/2000 | Lu .............................. 714/741 |
| 6,067,262 A | * | 5/2000 | Irrinki et al. ................ 365/201 |
| 6,367,042 B1 | * | 4/2002 | Phan et al. ................... 714/733 |
| 6,397,349 B2 | * | 5/2002 | Higgins et al. ................. 714/7 |

OTHER PUBLICATIONS

"Testing Semiconductor Memories Theory and Practice", Author A.J. van de Goor Delft University of Technology Department of Electrical Engineering the Netherlands 1998 pp. 339–423.

* cited by examiner

Primary Examiner—Albert Decady
Assistant Examiner—Shelly A Chase
(74) Attorney, Agent, or Firm—David B. Ritchie; Masako Ando; Thelen Reid & Priest, LLP

(57) ABSTRACT

A reconfigurable built-in self-test ("BIST") engine for testing a reconfigurable memory is disclosed. The BIST engine executes a test on a memory for detecting faults. If the memory under test fails the test executed by the BIST engine, a decision is made depending on whether it is possible to reconfigure the memory under test. If memory reconfiguration is possible, the memory under test is reconfigured, such as by disabling the bad half of the memory under test. Once the memory under test is reconfigured, the BIST engine is also reconfigured in a manner appropriate for the type of BIST engine—centralized or distributed. In the case of a centralized BIST engine, a centralized BIST controller is modified to generate addresses corresponding only to the good half of the memory under test. In the case of a distributed BIST engine, a BIST meta-controller is modified to disable distributed BIST engines corresponding to memory sub-blocks in the bad half of the memory under test and to ignore error signals reported by any such disabled distributed BIST engines. The reconfigured memory under test is then tested with the reconfigured BIST engine.

74 Claims, 14 Drawing Sheets

RECONFIGURABLE BUILT-IN SELF-TEST ENGINE FOR TESTING A RECONFIGURABLE MEMORY

BACKGROUND OF THE INVENTION

1. Field of the Invention

The present invention relates to integrated circuits ("ICs") and, more particularly, to an apparatus and method for providing a reconfigurable Built-in Self-Test ("BIST") engine for testing a reconfigurable memory, such as an on-chip cache in a microprocessor.

2. The Background Art

BIST is one of the methods known to those of ordinary skill in the art for testing memory arrays on an IC for manufacturing defects. This method, commonly known as "memory BIST," typically uses on-chip logic that generally includes a data pattern generator, an address generator, a comparator (or a signature analyzer) and a finite state machine. Commonly, all of this logic is collectively referred to as "the BIST engine." As is well known to those of ordinary skill in the art, a class of memory test algorithms, called "march algorithms," are commonly used to read and write specific data patterns to the memory under test in specific address sequences. The BIST engine is designed to perform the selected memory test algorithm, and the associated circuitry is designed as an integral part of the IC itself. For the purposes of the present invention, the term "IC" is used synonymously with the term "chip," and both terms are well-known to those of ordinary skill in the art.

Some modern microprocessors implement both a level-1 ("L1") and a level-2 ("L2") cache directly on the microprocessor IC. One of the ways to test the L2 cache is by using a BIST engine, partly because the L2 cache is not directly accessible or testable via external pins on the microprocessor IC. During IC manufacturing, it is well known to those of ordinary skill in the art to replace some of the faulty rows and/or columns in the L2 cache and other large memories with redundant rows and/or columns to enhance yield. Normally, only relatively few (e.g., two to four) redundant rows and/or columns are provided for repair. If there are any additional manufacturing defects in the memory after all the redundant rows and/or columns available for repair have been used, the IC is deemed to be faulty and typically discarded.

However, in the special case of block-based memory circuits such as L2 caches, some of these "faulty" ICs can be productized into ICs with a smaller level 2 cache. Because the design of an L2 cache is typically based on blocks, if the blocks corresponding to half of the address space of the cache are not faulty, the IC may still be marketed as a good, working microprocessor, but having a smaller cache. For example, a microprocessor nominally having a 512 KB L2 cache may be marketed as microprocessor having a 256 KB L2 cache, with the faulty half of the L2 cache deactivated. One mechanism known to those of ordinary skill in the art for de-activating the faulty half of the L2 cache consists of either a hardware programmable or software programmable fuse (of which there may be more than one) that can be set after the die is manufactured. Without limitation, in the hardware programmable version of the fuse, the fuse is blown using a laser or "e-fuse" (which is typically implemented by driving high current through the device pins to blow the fuse). Without limitation, in the software programmable version of the fuse, it is programmed by writing to a programmable register (which is typically "one-time programmable," such as an EPROM or flash memory). Once the memory structure is tested and the faulty half of the memory device is identified, the fuse is programmed to de-activate the faulty half and to reconfigure the memory into a smaller size. Even though it is not practically useful, a memory can be reconfigured to one-fourth, one-eight, etc. (inverse powers of two).

If the reconfigured memory must be retested, the original BIST engine design cannot be used without modification, since it is designed to run the march test algorithm on the original (e.g., 512 KB) L2 cache. The memory BIST algorithm, if executed using the original BIST engine, would flag the cache as faulty, since the original BIST engine is designed to test the entire memory. Moreover, it will unnecessarily test an area of the cache that has been determined not to be a part of the functioning microprocessor.

Thus, what is needed is a reconfigurable BIST engine that is automatically reconfigured whenever the memory being tested is reconfigured, such that the reconfigured memory can be automatically tested. Unfortunately, no such reconfigurable BIST engine is currently available. The present invention addresses this and other problems. These and other features and advantages of the present invention will be presented in more detail in the following specification of the invention and in the associated figures.

SUMMARY OF THE INVENTION

A reconfigurable built-in self-test ("BIST") engine for testing a reconfigurable memory is disclosed. The BIST engine executes a test on a memory for detecting faults. If the memory under test fails the test executed by the BIST engine, a decision is made depending on whether it is possible to reconfigure the memory under test. If memory reconfiguration is possible, the memory under test is reconfigured, such as by disabling the bad half of the memory under test. Once the memory under test is reconfigured, the BIST engine is also reconfigured in a manner appropriate for the type of BIST engine—centralized or distributed. In the case of a centralized BIST engine, a centralized BIST controller is modified to generate addresses corresponding only to the good half of the memory under test. In the case of a distributed BIST engine, a BIST meta-controller is modified to disable distributed BIST engines corresponding to memory sub-blocks in the bad half of the memory under test and to ignore error signals reported by any such disabled distributed BIST engines. The reconfigured memory under test is then tested with the reconfigured BIST engine.

BRIEF DESCRIPTION OF THE DRAWINGS

The accompanying drawings, which are incorporated in and constitute a part of this specification, illustrate an embodiment of the invention and, together with the present description, serve to explain the principles of the invention.

In the drawings.

DETAILED DESCRIPTION

Figure 1:
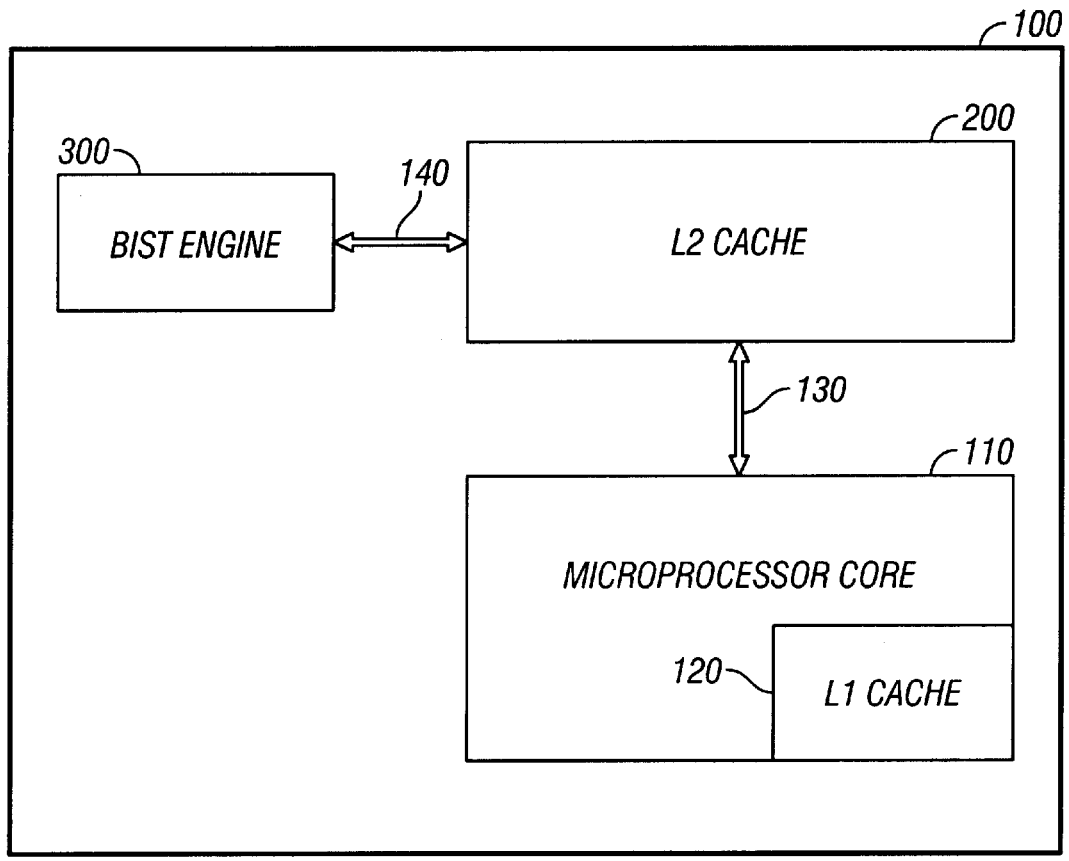
FIG. 1 is a simplified block diagram of a microprocessor integrated circuit ("IC") having an embedded memory capable of being tested by a BIST engine in accordance with aspects of the present invention.

One embodiment of the present invention is described herein in the context of a reconfigurable BIST engine for testing the L2 cache memory on a microprocessor IC. Those of ordinary skill in the art will realize that the following description of the present invention is illustrative only and not in any way limiting. Other embodiments of the invention will readily suggest themselves to such skilled persons having the benefit of this disclosure. Reference will now be made in detail to an implementation of the present invention as illustrated in the accompanying drawings. The same reference numbers will be used throughout the drawings and the following description to refer to the same or like parts.

In the interest of clarity, not all the routine features of the implementations described herein are described. It will of course be appreciated that in the development of any such actual implementation, numerous implementation-specific decisions must be made to achieve the developers' specific goals, such as compliance with system- and business-related constraints, and that these goals will vary from one implementation to another. Moreover, it will be appreciated that such a development effort might be complex and time-consuming, but would nevertheless be a routine undertaking of engineering for those of ordinary skill in the art having the benefit of this disclosure.

As mentioned earlier, certain memory devices such as on-chip L2-cache memories in a microprocessor can be reconfigured (e.g., by using a programmable fuse). For example, if one half of a 512 KB cache on a microprocessor is determined to be faulty, it can be reconfigured as a 256 KB cache by de-activating the faulty half the cache. In the context of the present invention, these will be referred to as the "left half" and the "right half" of the cache. In the present context, relative terms such as "left" and "right" refer to the logical address space only, and are not intended to convey any physical or geometric orientation limitations. In a practical implementation, when a memory is reconfigured such as by disabling one "half" of its logical address space, the remaining "half" may be physically scattered throughout the device, with some sub-blocks physically located near each other in a neat geometric pattern, while other sub-blocks belonging to the same "half" may be physically located in non-intuitive and non-contiguous regions of the IC, whose location will be dictated by a variety of circuit design considerations well-known to those of ordinary skill in the art.

Typically, the address-to-layout mapping of a cache or similar memory device is such that one address bit (e.g., a bit denominated as bit "M" in this context), determines whether the physical location addressed falls in one logical half or the other. For example, one address-to-layout mapping implementation would be such that all addresses with address bit M equal zero would fall in the left half, and all addresses with the address bit M equals one will fall in the right half. Once again, from a physical layout standpoint, it must be emphasized that the bits of a given "half" may be scattered throughout the device.

If the left half is faulty, the programmable fuse is used to permanently set address bit M internally in the IC to 1. Therefore, whatever addresses are used, the left half of the cache (which happens to be the faulty half, according to the labeling convention used herein), is never addressed. In the special case of an L2-cache, for example, reconfiguring the memory in such a way is possible, because the size of the address space is not critical for functionality (only for performance). As those of ordinary skill in the art will recognize, so long as the L2-cache is designed to produce the correct interface signals to its surrounding circuitry regardless of the cache memory size, it may still operate normally. Other types of memories may also employ the techniques according to the present invention. However, depending on the requirements of each particular implementation, various modifications readily ascertainable by those of ordinary skill in the art may be required to the memory interface/control circuitry.

However, the original BIST engine designed for the full 512 KB cache cannot be used for testing the reconfigured 256 KB cache, since the address space that the BIST controller must sequence through is different now.

FIG. 1 is a simplified block diagram of a microprocessor integrated circuit ("IC") having an embedded memory capable of being tested by a BIST engine in accordance with aspects of the present invention. As shown in FIG. 1, microprocessor 100 comprises a microprocessor core 110 having an L-1 cache memory 120, an embedded memory (e.g., an L2 cache) 200, and a BIST engine 300. The microprocessor core 110 communicates with embedded memory 200 via a bidirectional bus 130, which comprises a set of address lines, data lines, and control lines. As will be discussed in more detail later, when the microprocessor 100 is commanded to operate in BIST mode, embedded memory 200 is controlled by the BIST engine 300 via a bidirectional bus 140, which also comprises a set of address lines, data lines, and control lines.

The trend in modern microprocessor integrated circuits is to include large amounts of internal memory. This memory is known as "internal embedded memory" because it is located on the integrated circuit and has limited accessibility both logically and physically (there are usually many levels of logic and convoluted pathways of logic to be able to place or retrieve data to or from a memory location-and most modern fabrication methods bury the physical memory cells, or arrays of memory cells, into the lower layers of the integrated circuit so that there is no direct physical access to the arrays of memory). As is well known to those of ordinary skill in the art, embedded memory is difficult to test and verify in all necessary test environments, most specifically, determining faults resulting from the silicon manufacturing process (fabrication test), determining faults due to the dicing and packaging process (manufacturing test), and determining faults that cause infant mortality due to the stresses of first applying power (voltage, current, and the effects of operating temperature) to the device.

Since the function of the memory is very critical to the overall integrated circuit function, it is very important to verify that the memory survives through the overall manufacturing process and still operates as it was intended to. This means that a high level of testing is required to identify memory problems, and more testing is required to locate the source of the problem so that any problem can be corrected. An appropriate level of testing is not always possible for embedded memories unless specific test logic and architectures are included during the design process.

Figure 2A:
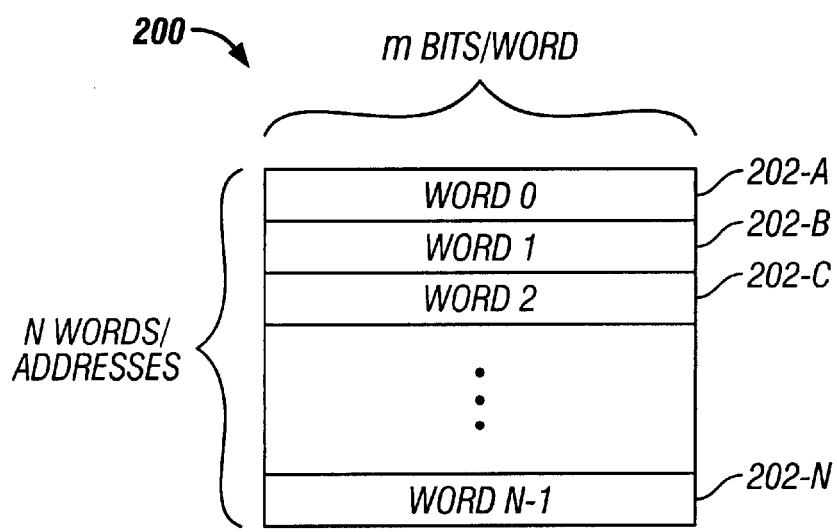
FIG. 2A is a block diagram illustrating the logical organization of a general memory device.

FIG. 2A is a block diagram illustrating the logical organization for a general memory device. As is well known to those of ordinary skill in the art, a memory device such as embedded memory 200 shown in FIGS. 1 and 2 is typically organized logically as a set of N memory words 202-A–202-N, with each memory word 202 comprising m bits. For example, a 512 KB memory device comprises N=524,288 memory words, with m=8 bits per memory word. As another example, a 4 Megabit memory device may be logically organized as a "1 Mbit×4" device, comprising N=1,048,576 memory words, with m=4 bits per memory word.

Figure 2B:
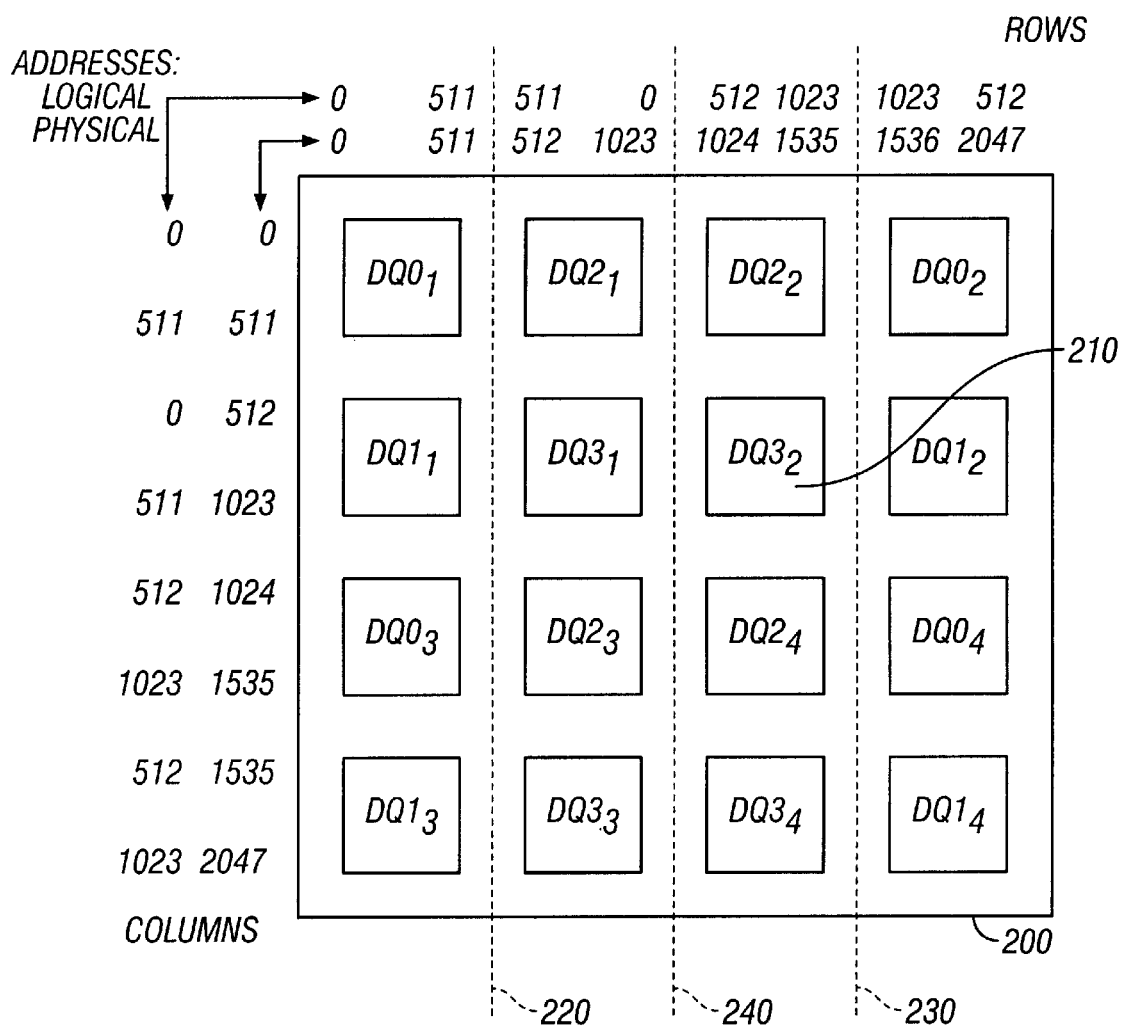
FIG. 2B is a block diagram illustrating the physical organization of an exemplary memory device.

FIG. 2B is a block diagram illustrating the physical organization for an exemplary memory device. Referring to FIG. 2B, an exemplary block diagram of a 4 Megabit memory device organized as "1 Megabit by 4" is shown having four memory cell arrays DQ0–DQ3 that are each subdivided into four blocks, represented by subscripts "1" through "4." By dividing the memory into four memory cell arrays DQ0–DQ3, data is multiplexed so that each memory array is addressed by its own data line, and therefore the device 200 has four data lines DQ0–DQ3. During a write cycle, the device 200 stores one bit of data in a particularly addressed memory location in each of the four memory arrays DQ0–DQ3. Since the device 200 is a one megabit by four memory device, 1,024 row lines and 1,024 column lines are used to access one of the 1,048,576 memory cells in each of the four memory cell arrays DQ0–DQ3. And, as will be described in more detail below, a total of 20 address lines are needed to access each one of the 1,048,576 memory cells in each of the four memory cell arrays DQ0–DQ3.

As shown along the top and left side of the device 200 in FIG. 2B, the logical addresses for accessing the various blocks of memory cells differs from the physical addresses of such memory cells. For example, if the device 200 were simply a four megabit by one memory device, the logical addresses could be equivalent to the physical addresses, so that the first memory location in the upper left corner of the block DQ01 of memory locations would have a logical and physical address of (0,0) which corresponds to the row and column address, and x and y axis physical locations, of the memory cell, all respectively. Similarly, in this example, the lower-most right-hand memory location in the block DQ14 would have the logical and physical address of (2047,2047).

For reasons such as fabrication ease and reducing line capacitances, and to improve the overall performance of the device 200, the blocks of memory cells, for the four arrays of memory cells DQ0–DQ3, are arranged in predetermined patterns. For example, a single memory location 210 in the memory block DQ32 may have a logical row and column address of (384,640), but a physical address or location of (1152,896). As shown, the logical row addresses for bits 0–511 ascend from left to right for the block DQ01, but its adjacent block DQ21 has row addresses that descend from left to right from 511 to 0. The vertical dashed line 220 shown in FIG. 2B visually illustrates that the memory blocks are mirrored in the device 200. In other words, the blocks DQ01, DQ11, DQ03 and DQ13 are accessed by logical row addresses 0–511 in left to right order, while the memory cell blocks DQ21, DQ31, DQ23, and DQ33 are accessed by logical row addresses 511–0 from left to right. The other columns of memory blocks are similarly mirrored in the device 200. For example, dashed vertical line 230 defines another set of mirrored blocks, with blocks DQ22, DQ32, DQ24 and DQ34 being accessed by logical row addresses 512–1023 in left to right order, while the memory cell blocks DQ02, DQ12, DQ04, and DQ14 are accessed by logical row addresses 1023–512 from left to right. Other semiconductor devices known by those skilled in the relevant art have similar mirrored layouts, or other arrangements of memory blocks.

It should be emphasized that the memory device depicted in FIG. 2B and described above is exemplary only, and a detailed discussion of it has been provided simply for the purpose of explaining the concepts of logical-address-to-layout mapping of memory devices. As those of ordinary skill will recognize, memory devices may be physically laid out in many different ways, depending on the requirements of each particular implementation. For example, a neat grid-like sub-block layout such as shown in FIG. 2B is not necessary, and portions of the memory structure/device may be physically scattered or distributed throughout the IC. Moreover, the address rows and/or columns need not be laid out in order, and the memory organization from an input/output ("I/O") standpoint may vary from that shown in the figure (e.g., "1 M×4," "4 M ×1," and "512 kilobit by 8" are three different ways of organizing a 4 megabit memory device).

Figure 3:
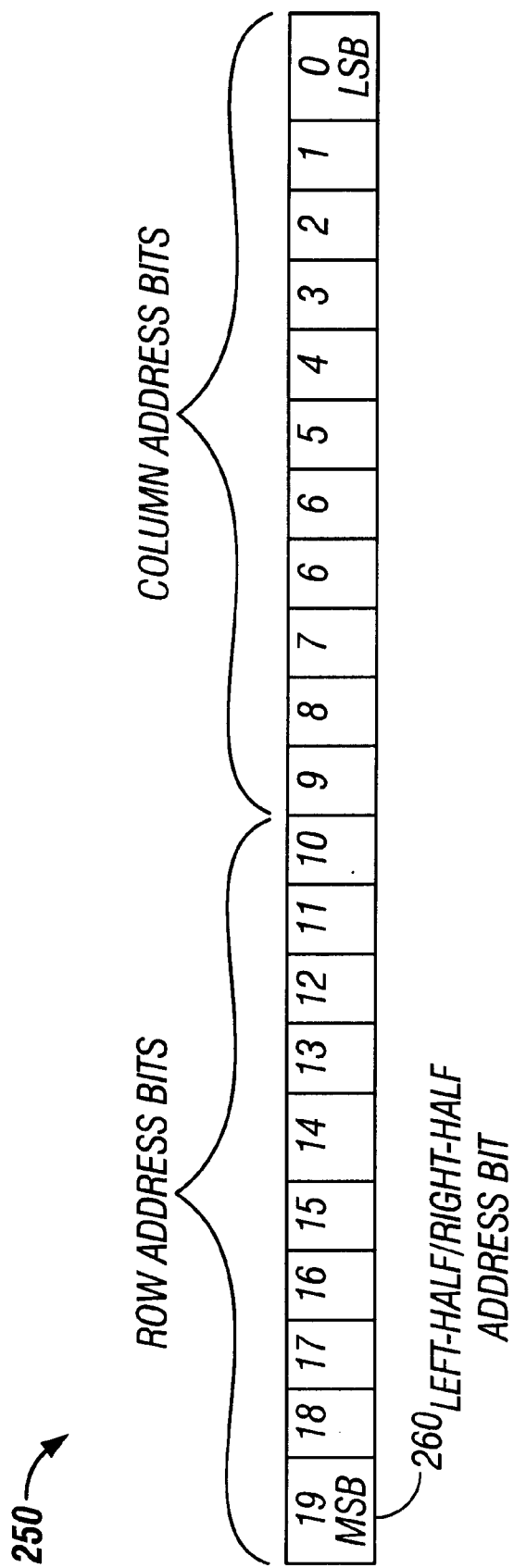
FIG. 3 is a block diagram illustrating the logical organization of an exemplary memory address word.

FIG. 3 is a block diagram illustrating the logical organization of an exemplary memory address word 250 suitable for addressing the physical structure of a 4 megabit memory structure organized as a "1 Mbit x 4" device, as illustrated in FIG. 2B. As shown in FIG. 3, memory word 250 comprises 20 bits, labeled from bit 0 to bit 19, with bit 0 being the least significant bit ("LSB") and bit 19 being the most significant bit ("MSB"). In terms of the physical structure depicted in FIG. 2B, bits 10 through 19 of memory address word 250 shown in FIG. 3 correspond to row address bits, while bits 0 through 9 of memory address word 250 correspond to column address bits. As those of ordinary skill in the art will recognize, MSB bit 19 (labeled as element 260 in FIG. 3) is the bit that determines whether the "right half" or the "left half" of the memory structure shown in FIG. 2B is being addressed. In other words, when MSB bit 19 equals zero, the addresses fall to the left of dashed vertical line 240 in FIG. 2B, and when MSB bit 19 equals one, the addresses fall to the right of dashed vertical line 240.

A memory device such as device 200 shown in FIG. 2B may experience a variety of faults. Without limitation, these include Stuck-At Faults, Stuck-Open Faults, Transition Faults, Coupling Faults, Data Retention Faults, Linked Coupling Faults, and/or Multi-Port Faults. As will be described in more detail in subsequent sections of this document, BIST tests can identify and isolate various types of such faults.

Stuck-At Faults ("SAFs") are characterized by the presence of a logic "1" or "0" in a memory location in a memory device notwithstanding the fact that a "0" or "1", respectively, had been previously written to that location. Stuck-Open Faults ("SOFs") are characterized by an open read or write line to each storage location, such that the value read from the memory corresponds to a previously written value rather than its current value. A Transition Fault ("TF") is characterized by the failure of the value of a bit stored in the memory to transition from a logic "1" to "0" (or vice versa) following a pair of write operations during which a logic "1" and "0", respectively, (or a logic "0" and "1", respectively) were written.

As is known to those of ordinary skill in the art, Coupling Faults ("CFs") are characterized by inversion, idempotent and state coupling, respectively, of a bit stored in the memory. A Data Retention Fault ("DRF") is characterized by the loss of a data value stored in a memory bit in the memory over time. This type of fault is associated with Dynamic Random Access Memories (DRAMs), as opposed to Static Random Access Memories ("SRAMs"). Linked Coupling Faults ("LCFs") are characterized by the simultaneous occurrence of two coupling faults and Linked Transition and Coupling Faults. Finally, Multi-Port Faults ("MPFs") are characterized by faults associated with the mechanism within each storage location that allows for accessing via multiple input and output ports.

If an embedded memory is buried deeply within an IC (such as shown in FIG. 1), BIST is often considered the most practical and efficient test methodology, and it is becoming increasing popular with semiconductor vendors. BIST allows the memory to be tested quickly, at the functional speed of the chip, with a reasonably high degree of fault coverage, without requiring complex external test equipment and large amounts of external access circuitry. One advantage BIST has over many traditional testing methods is that with BIST, memory or logic circuitry can be tested at any time in the field. This capability offers some degree of continued fault protection.

BIST refers in general to any test technique in which test vectors are generated internal to an integrated circuit. As will be described in more detail in subsequent sections of this document, test vectors are sequences of signals that are applied to integrated circuitry to determine if the integrated circuitry is performing as designed. BIST can be used to test memories located anywhere on the IC without requiring dedicated I/O pins, and can be used to test memory or logic circuitry every time power is applied to the IC, thereby allowing an IC to be easily tested after it has been incorporated in an end product.

In general, in the BIST approach, a test pattern generator and test response analyzer are incorporated directly into the device to be tested. BIST operation can be controlled by supplying an external clock and utilizing a simple commencement protocol. BIST test results are typically compressed, usually to the level of "pass" or "fail." That is, at the end of a typical structured BIST test, or "run", a simple pass/fail signal is asserted, indicating whether the device passed or failed the test. Intermediate pass/fail signals may also be provided, allowing individual memory locations or group of locations to be analyzed. Unlike external testing approaches, at-speed testing with BIST is readily achieved. BIST also alleviates the need for long and convoluted test vectors, and may function as a surrogate for functional testing or scan testing. Further, since the BIST structures remain active on the device, BIST can be employed at the board or system level to yield reduced system testing costs, and to reduce field diagnosis and repair costs.

As mentioned earlier, in addition to these BIST testing procedures, manufacturers utilize a number of techniques to repair faulty memories when feasible. Such techniques include bypassing defective cells using laser procedures and fused links that cause address redirection. However, such techniques are typically limited to one-time repair and require significant capital investment.

In order to enhance the repair process, on-chip built-in self repair ("BISR") circuitry for repairing faulty memory cells has evolved. BISR circuitry typically functions internally to the integrated circuit without detailed interaction with external test or repair equipment. In the BISR approach, suitable test algorithms are preferably developed and implemented in BIST or BIST-like circuitry. These test patterns may be capable of detecting stuck-at, stuck-open, and bridging faults during memory column tests, as well as memory cell faults and retention faults during memory row tests. Following execution of the test patterns, the BISR circuitry analyzes the BIST "signature" (i.e., the test results) and, in the event of detected faults, automatically reconfigures the defective memory utilizing redundant memory elements to replace the defective ones. A memory incorporating BISR is therefore defect-tolerant. Redundancy is typically implemented by using a laser to explode or evaporate conductors formed in the chip, and thereby physically disconnect the defective components and substitute the functional redundant components.

Figure 4:
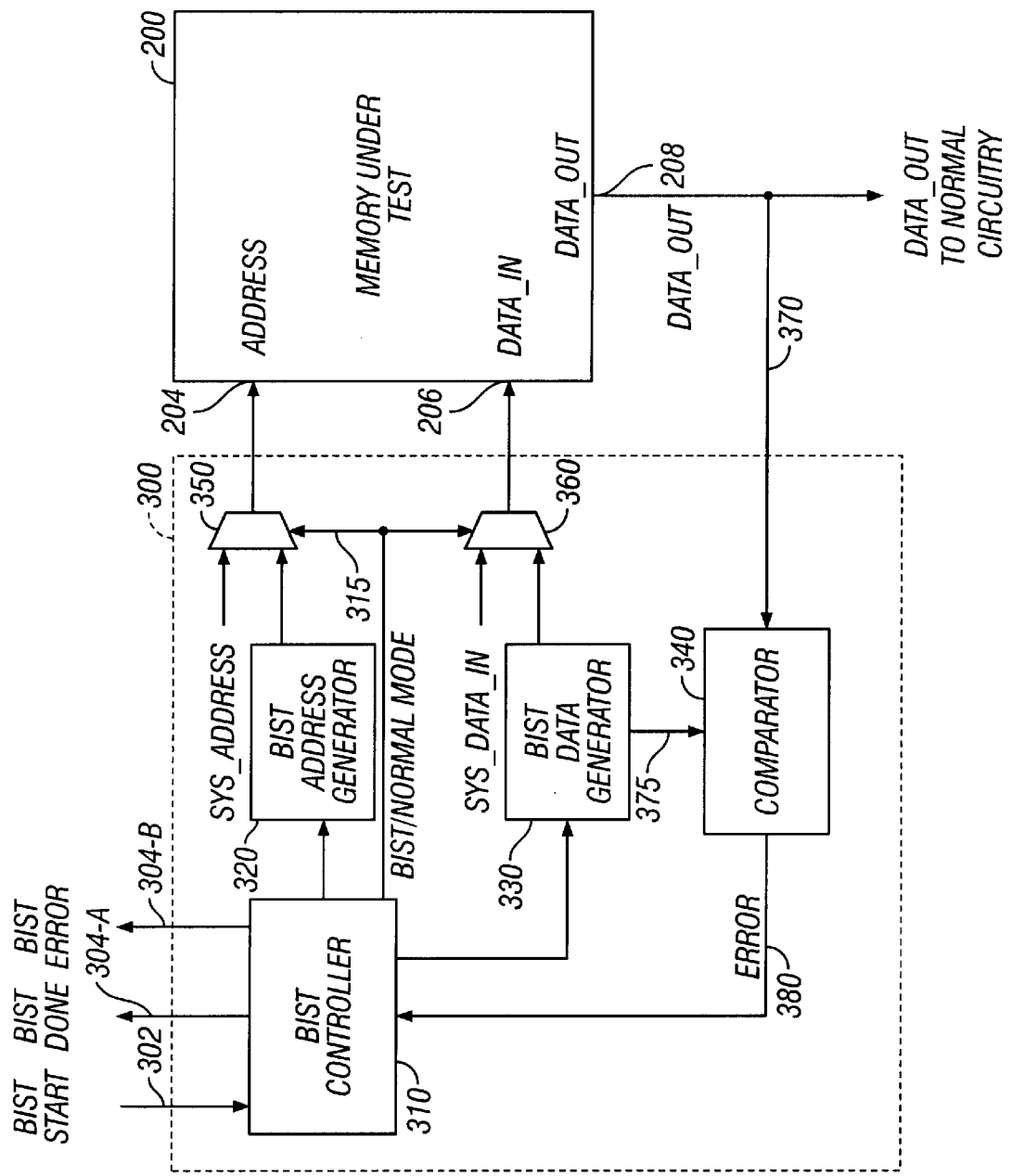
FIG. 4 is a generalized block diagram of a memory device coupled to a BIST engine in accordance with aspects of the present invention.

FIG. 4A is a generalized block diagram of a memory device 200 coupled to a BIST engine 300 in accordance with aspects of the present invention. As shown in FIG. 4A, BIST engine 300 comprises a BIST controller 310, a BIST address generator 320, a BIST data generator 330, a comparator 340, an address multiplexer 350, and a data multiplexer 360. In the context of the present invention (and as shown in FIG. 4), the interfaces to the memory under test 200 comprise an address port 204, a data input port 206, and a data output port 208. Those of ordinary skill in the art will recognize that in a practical implementation, additional interfaces such as control signals would also be required. However, these are not described in further detail herein so as not to overcomplicate the present discussion. During normal (i.e., non-BIST) operation, when writing data, an address (i.e., SYS_ADDRESS) would be presented to the memory under test 200 at the address port 204, along with the data to be written (i.e., SYS_DATA_IN), which would be presented at the data input port 206. Similarly, when reading data from memory 200, an address (i.e., SYS_ADDRESS) would be presented to the memory under test 200 at the address port 204, and the requested data (i.e., DATA_OUT) would be presented by the memory under test 200 at the data output port 208.

During BIST mode, the normal system addresses (i.e., SYS_ADDRESS) and input data (i.e., SYS_DATA_IN) described above are overridden with addresses and data provided by the BIST engine 300, as described in further detail herein. A BIST START signal 302 commands BIST controller 310 to initiate BIST mode. Depending on the specific requirements of each particular implementation, the BIST START signal 302 may be provided via an external IC pin, via a boundary scan register, or via any other suitable mechanism. In general, BIST engines are based on the principle of writing known data values into various addresses of the memory being tested, then reading the values stored at those addresses and comparing the values read out against the known values that were previously written into the memory. Thus, as shown in FIG. 4A, BIST engine 300 comprises a BIST address generator 320 and a BIST data generator 330, both of which are under control of the BIST controller 310. A set of testing algorithms known to those of ordinary skill in the art as "march tests" (to be discussed in more detail later) are commonly used to test semiconductor memories.

Address multiplexer 350 and data multiplexer 360 are also under control of the BIST controller 310. Specifically, a signal called BIST/NORMAL MODE 315 shown in FIG. 4A controls the select line of address multiplexer 350 and data multiplexer 360, such that the SYS_ADDRESS and SYS_DATA_IN signals are presented to the memory under test 200 while the memory 200 operates in its normal mode. However, during BIST mode, the address presented at the address port 204 of the memory under test 200 equals the output of the BIST address generator 320, and the data presented at the data input port 206 of the memory under test 200 equals the output of the BIST data generator 330. During BIST mode, the data presented by the memory under test 200 at its data output port 208 is presented to comparator 340 over line 370. Comparator 340 compares the data presented by the memory under test 200 with the known data value that had previously been provided by BIST data generator 330. Signal on line 375 shown in FIG. 4A depicts the communication path between the BIST data generator 330 and the comparator 340. If the two values are different, comparator 340 reports an error condition to BIST controller 310 via error line 380.

It should be emphasized that the generalized BIST architecture depicted in FIG. 4 is intended to be exemplary only, and that many modifications are possible within the scope of the present invention. For example (and without limitation), those of ordinary skill in the art will recognize that comparator 340 may be implemented as a multiple input shift register ("MISR"), and that the address generator 320 and/or the data generator 330 may be implemented as counters and/or linear feedback shift registers ("LFSRs"). Also, as mentioned earlier, the BIST architecture depicted in FIG. 4 has been simplified (e.g., memory control lines are not shown) to provide a clear explanation.

Still referring to FIG. 4, if an error is detected in the memory, BIST engine 300 reports it via the BIST ERROR signal 304-B. If the test finishes without an error, it reports it via the BIST DONE signal 304-A. Depending on the specific requirements of each implementation, the BIST DONE/ERROR signals may comprise a simple PASS/FAIL indication, or may provide additional information in case of an error, such as the memory addresses at which errors were encountered. The BIST DONE and BIST ERROR signals 304-A and 304-B may be routed to an external IC pin, to a boundary scan register, or may be reported via any other suitable mechanism.

A LFSR in its basic form is a standard design element that consists of an n-bit shift register that has some of its output signals brought back to the beginning of n-bit shift register through Exclusive-Or ("XOR") logic circuitry. It operates by shifting a stream of bits from one end to the other (for example from the left-most bit towards the right-most bit). The state of all of the bits and the applied input signals all factor into the next state of the register. When used as a pattern generator the device is sometimes called a PRPG LFSR or Pseudo-Random Pattern Generator Linear Feedback Shift Register (since it will always repeat a set of patterns for a given initial state, it is not entirely random but rather pseudo-random). The feedback for a PRPG is usually chosen to be a maximal polynomial, which simply means that the feedback is implemented in such a way as to cause the register to cycle through all possible states except the all zero state. A pattern generator typically does not have any external inputs, but instead starts from a fixed state (the seed) and continues through the sequence of all possible patterns at the rate of one pattern every time a clock signal is applied.

When a PRPG is used for address control information, the resulting sequence of addresses is in some non-ordered sequence. This means that the memory cannot be tested in a directed order based on its physical layout. Since memory faults are highly coupled to the exact physical topology, it is impossible to match a standard LFSR data and address sequence to exercise the most probable failure mechanisms.

When an LFSR is used for pattern compression, it is known as a signature analyzer. In this case, there is an initial state (a seed) and external input to the device. Each clock cycle captures the input and operates on it based on the state of the register and the feedback designed in.

As mentioned earlier, this testing may be accomplished by performing a Memory Built-In-Self-Test ("BIST") which can be invoked by transitioning a single external pin on the data processor or alternatively by placing a control word within an internal control register of the data processor and supplying only the data processor functional clock signal. The BIST is typically accomplished by conducting a sequence of events that is controlled by a minimal amount of circuitry and is fully self-contained within the IC being tested.

In particular, the BIST is designed to select a single memory out of a set of many different memories (e.g., a plurality of four way set associative memories, where each memory may have different row depth, word bit lengths, number of banks, and address and data space relative to the common busses). Then, the BIST selects a memory word location (a row containing 32 bits) within the selected memory by directly generating and applying an address. A 32-bit value may be referred to herein as a longword data value. The BIST sequence then performs a write to each different memory location within the selected memory, with a specific set of repeated test patterns created within the IC's single centralized test controller unit, and also performs a read from each memory location which simultaneously captures the results of the reading into a data compressing register. The data compressing register (i.e., a signature analyzer) is typically also contained fully within the single test controller within the IC. The sequence controller selects a next memory after the first memory is tested and repeats the above steps until all memories in the data processor are tested.

Figure 5:
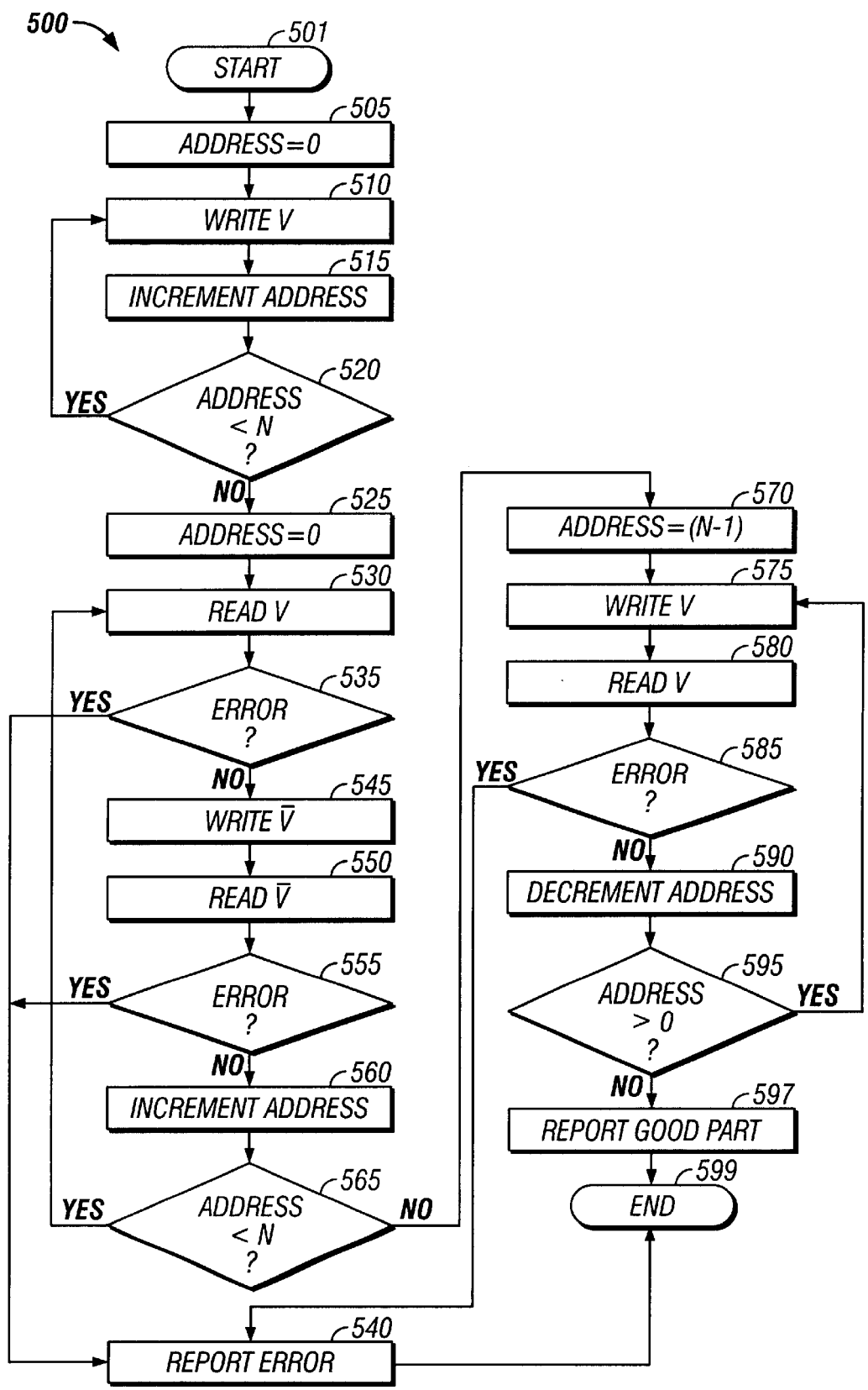
FIG. 5 is a flow chart illustrating an exemplary BIST algorithm for testing a semiconductor memory device according to aspects of the present invention.

FIG. 5 is a flow chart illustrating an exemplary BIST algorithm for testing a semiconductor memory device that may be implemented with the BIST architecture depicted in FIG. 4 according to aspects of the present invention. The algorithm depicted in FIG. 5 corresponds to a 6N (also known as a "MATTS+") march algorithm. Those of ordinary skill in the art will recognize that numerous alternative testing algorithms may be implemented without departing from the scope of the present invention.

As is well-known to those of ordinary skill in the art, march algorithms (also known as "march tests") are a finite sequence of tests to be preformed on every cell in the memory array before moving on to the next cell. Typically, in a march test, all cells of the memory array are subjected to the same tests and are traversed in order, either forwards or backwards.

As shown in FIG. 5, the process starts at step 501 with the BIST START signal 302 (see FIG. 4) being asserted. At this point, address multiplexer 350 and data multiplexer 360 are commanded to switch to BIST mode, meaning that the address provided by the BIST address generator 320 is presented to the address port 204 of the memory under test 200, and that the data generated by the BIST data generator 330 is presented to the data input port of the memory under test 200. Still referring to FIG. 5, at step 505 the address provided by address generator 320 (see FIG. 4) is initialized to zero. At step 510, the data vector V is generated by the BIST data generator 330 (see FIG. 4) and written to the memory under test 200 at address zero. In this example, the data vector V comprises a set of alternating ones and zeros (e.g., "10101010" for a memory having 8-bit memory words). At step 515, the address is incremented, and at step 520, a decision is made depending on whether the current address is less than "N" (i.e. the last memory address in the memory under test plus one). If so, the process loops back to step 510, at which point the same data vector V is stored at the next address. Otherwise, the process continues with step 525.

Thus, at the point when step 525 is invoked, the data vector V has been written to all the memory locations of the memory under test. At step 525, the address provided by address generator 320 (see FIG. 4) is again initialized to zero. At step 530, the data stored at address zero is read out of the memory under test and compared with the data vector V which is expected. At step 535, a decision is made depending on whether the value read out of the memory under test equals the expected value or not. If there is an error (i.e., if the value read out of the memory does not equal the data vector V), the process proceeds to step 540, at which point an error is reported, and the process then terminates at step 599. Otherwise, if there is no error, then the inverse of data vector V is written at the current address in step 545. In the present context, the "inverse" of a data vector simply refers to the bit-wise inverse of the data vector. Thus, if the data vector V equals "10101010" in one implementation, as mentioned above, then the inverse of V would equal "01010101." Those skilled in the art will now recognize that various values of vector V can be used in a test algorithm, depending on the faults that are targeted, "01010101" is one typical value used in practice.

Still referring to FIG. 5, at step 550, the value stored at the current location of the memory under test (which is now expected to contain the inverse of data vector V) is read out of the memory. At step 555, a decision is made depending on whether the value read out of the memory under test equals the expected value or not. If there is an error (i.e., if the value read out of the memory does not equal the inverse of data vector V), then the process proceeds to step 540, at which point an error is reported, and the process then terminates at step 599. Otherwise, if there is no error, then the address is incremented at step 560. At step 565, a decision is made depending on whether the current address is less than "N." If so, the process loops back to step 530, at which point the value stored at the next address (which is expected to equal the data vector V) is read. Otherwise, the process continues with step 570.

At the point when step 570 is invoked, the inverse of data vector V has been written to all the memory locations of the memory under test. At step 570, the address provided by address generator 320 (see FIG. 4) is initialized to "N−1" (i.e. the last memory address in the memory under test). At step 575, the data vector V is once again written to the current memory location, and at step 580, the value stored at the current location of the memory under test (which is now expected to contain the data vector V) is read out of the memory. At step 585, a decision is made depending on whether the value read out of the memory under test equals the expected value or not. If there is an error (i.e., if the value read out of the memory does not equal the data vector V), then the process proceeds to step 540, at which point an error is reported, and the process then terminates at step 599. Otherwise, if there is no error, then the address is decremented at step 590. At step 595, a decision is made depending on whether the current address is greater than zero. If so, the process loops back to step 575, at which point the value stored at the next address (which is expected to equal the data vector V) is read. Otherwise, the process continues with step 597, at which point the memory under test 200 is determined to have passed the test. Finally, the process terminates at step 599.

Those of ordinary skill in the art will recognize that algorithms such as the march test algorithm 500 described above with reference to FIG. 5 are useful for detecting faults such as "stuck-at," "stuck-open," transition, coupling, and data retention faults.

Figure 6:
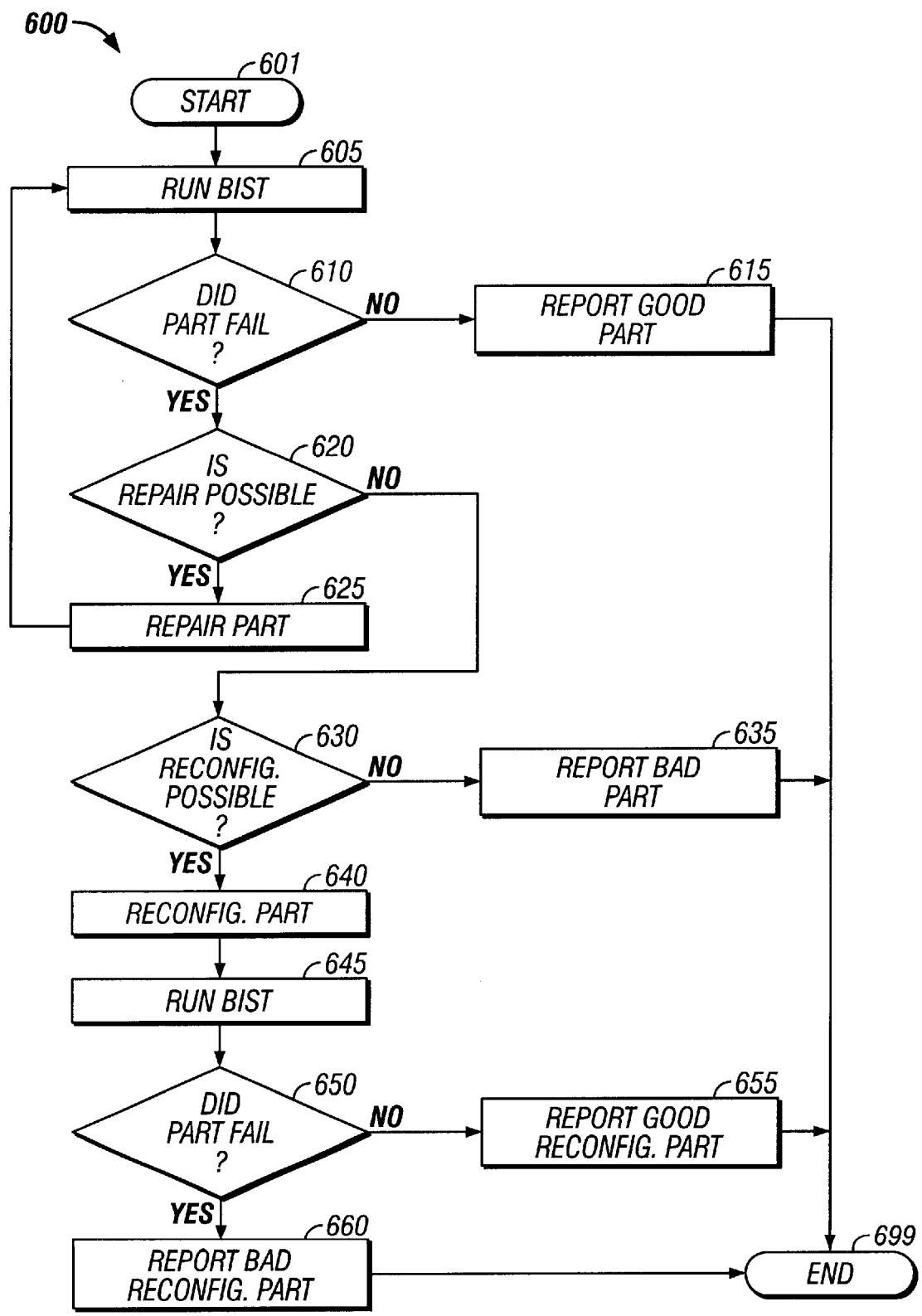
FIG. 6 is a flow chart illustrating an exemplary process for testing a semiconductor memory capable of being repaired and/or reconfigured according to aspects of the present invention.

FIG. 6 is a flow chart illustrating an exemplary process for testing a semiconductor memory capable of being repaired and/or reconfigured according to aspects of the present invention. Those of ordinary skill in the art will recognize that numerous alternative testing algorithms may be implemented without departing from the scope of the present invention. Referring to FIG. 6, the process starts at step 601, and at step 605, a BIST test is performed. For example, step 605 may be performed by executing the algorithm 500 depicted in FIG. 5 and described earlier. At step 610, a decision is made depending on whether the memory under test failed the BIST test performed at step 605 or not. If the part did not fail, then the part is reported as a "good" part at step 615, and the process terminates at step 699. On the other hand, if the part is determined to have failed the BIST test at step 610, then at step 620 a decision is made depending on whether the memory under test may be repaired or not. As mentioned earlier, memory devices are commonly manufactured with redundant memory elements (e.g., redundant memory rows and/or columns) which may be "swapped in" for memory elements determined to be non-functional. Therefore, if a repair is possible, then the repair is performed at step 625 using any suitable technique known to those of ordinary skill in the art, and the process then loops back to step 605, at which point the BIST test is repeated to determine whether the memory device has been properly repaired.

Still referring to FIG. 6, if at step 620 a determination is made that no repair of the memory under test is possible, then the process proceeds to step 630, at which point a decision is made depending on whether the memory under test may be reconfigured or not. As mentioned earlier, depending on where the "faulty" portions of the memory device are located on the memory device, it may be possible to disable one half of the memory device and market the IC having the memory device as a working IC with a smaller memory device (e.g., with a smaller L2 cache). If memory reconfiguration is not possible, then the process proceeds to step 635, at which point the memory device is reported to be "bad," and the process then terminates at step 699. However, if reconfiguration is possible, then the memory reconfiguration is performed at step 640 using any suitable technique known to those of ordinary skill in the art. After the memory is reconfigured, then a BIST test should once again be performed at step 645 on the reconfigured device. As will be described in more detail later in this document, the BIST test must be modified to test the reconfigured memory instead of the original memory (i.e., the memory before reconfiguration). Without a mechanism to reconfigure the BIST engine whenever the memory is reconfigured, then either the BIST test will always fail, or the BIST test must be skipped after the memory is reconfigured. Aspects of the present invention address this problem by disclosing various mechanisms for reconfiguring the BIST engine whenever the memory is reconfigured.

At step 650, a decision is made depending on whether the reconfigured memory device passed the BIST test of step 645 or not. If the memory device failed the BIST test of step 645, then the reconfigured device is reported as a "bad" part in step 660, and the process terminates at step 699. Otherwise, if the memory device passed the BIST test of step 645, then the reconfigured device is reported as a "good" part in step 655, and the process finally terminates at step 699.

Figure 7:
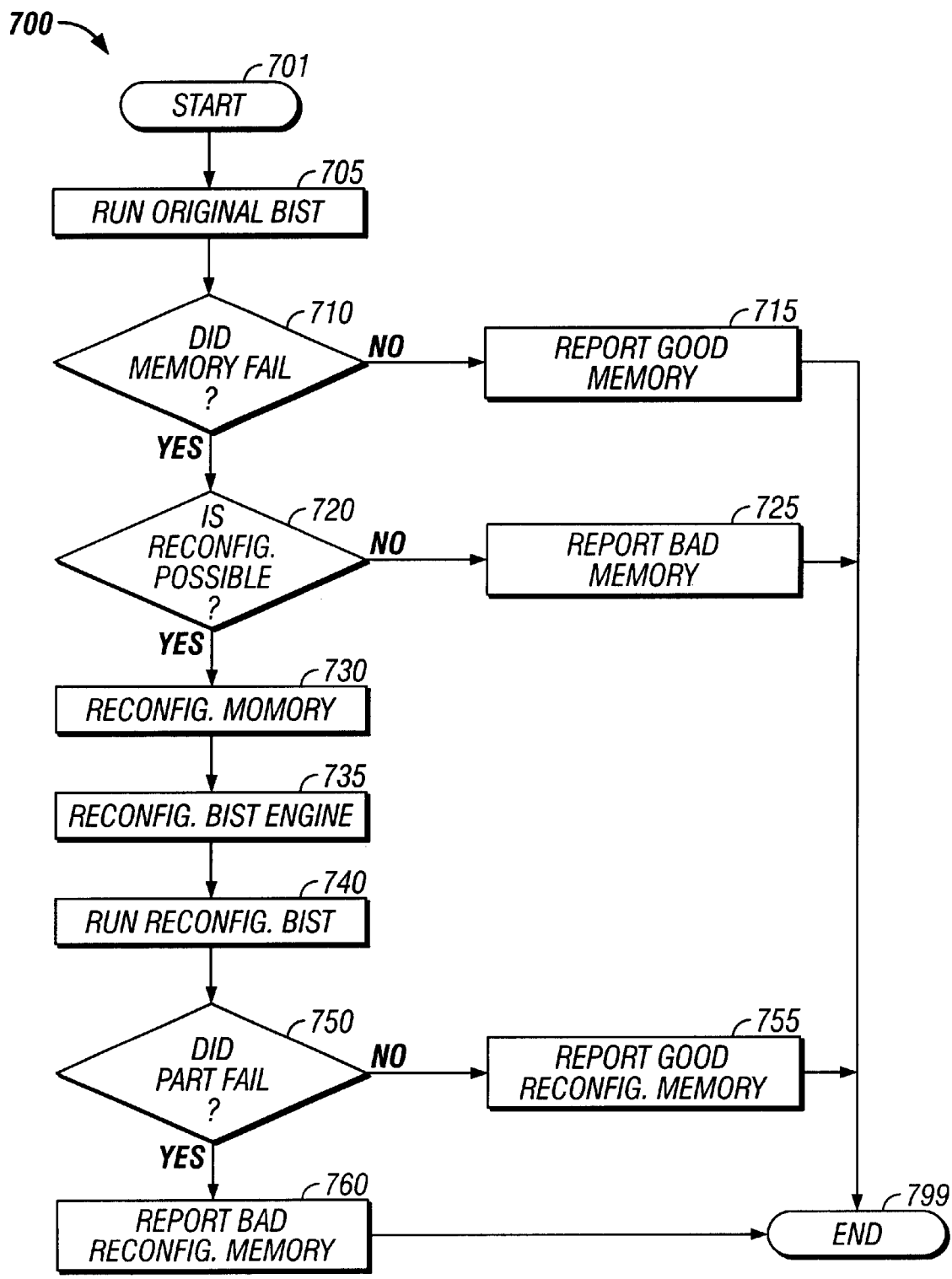
FIG. 7 is a flow chart illustrating an exemplary process for testing a semiconductor memory capable of being reconfigured and comprising a reconfigurable BIST engine according to aspects of the present invention.

FIG. 7 is a flow chart illustrating an exemplary process for testing a semiconductor memory capable of being reconfigured and comprising a reconfigurable BIST engine according to aspects of the present invention. Those of ordinary skill in the art will recognize that numerous alternative testing algorithms may be implemented without departing from the scope of the present invention. Referring to FIG. 7, the process starts at step 701, and at step 705, the original BIST test is performed. For example, step 705 may be performed by executing the algorithm 500 depicted in FIG. 5 and described earlier. At step 710, a decision is made depending on whether the memory under test failed the BIST test performed at step 705 or not. If the part did not fail, then the part is reported as a "good" part at step 715, and the process terminates at step 699. On the other hand, if the part is determined to have failed the BIST test at step 710, then at step 720 a decision is made depending on whether reconfiguration of the memory under test is possible or not. If memory reconfiguration is not possible, then the process proceeds to step 725, at which point the memory device is reported to be "bad," and the process then terminates at step 799. However, if reconfiguration is possible, then the memory reconfiguration is performed at step 730 using any suitable technique known to those of ordinary skill in the art. After the memory is reconfigured, then the BIST engine is also reconfigured at step 735 (as will be described in more detail later). It should be noted that, depending on the requirements of each particular implementation, the same mechanism (e.g., the same fuse or set of fuses) used to reconfigure the memory may also be used to reconfigure the BIST engine, in which case steps 730 and 735 may be combined into a single step. In other implementations, the memory reconfiguration mechanism may be different from the BIST engine reconfiguration mechanism, in which case steps 730 and 735 are separate, as shown in FIG. 7. Of course, the steps may be performed in a different order.

At step 740, the reconfigured BIST engine is used to run a new BIST test on the reconfigured memory device. At step 750, a decision is made depending on whether the reconfigured memory device passed the BIST test of step 740 or not. If the memory device failed the BIST test of step 740, then the reconfigured device is reported as a "bad" part in step 760, and the process terminates at step 799. Otherwise, if the memory device passed the BIST test of step 740, then the reconfigured device is reported as a "good" part in step 755, and the process finally terminates at step 699.

In the context of the present invention, BIST engines may be classified as either centralized or distributed BIST engines. In a centralized BIST architecture, there is only one BIST controller for the entire memory, and the finite state machine traverses the complete address space. In a distributed BIST architecture, each memory sub-block has a dedicated BIST controller that traverses the address space of that sub-block. A meta-controller sequences through the BIST controllers of the individual sub-block in a specified sequence. As will be described in more detail in subsequent sections of this document, these two general classes of BIST architectures require different mechanisms for reconfiguration.

Figure 8:
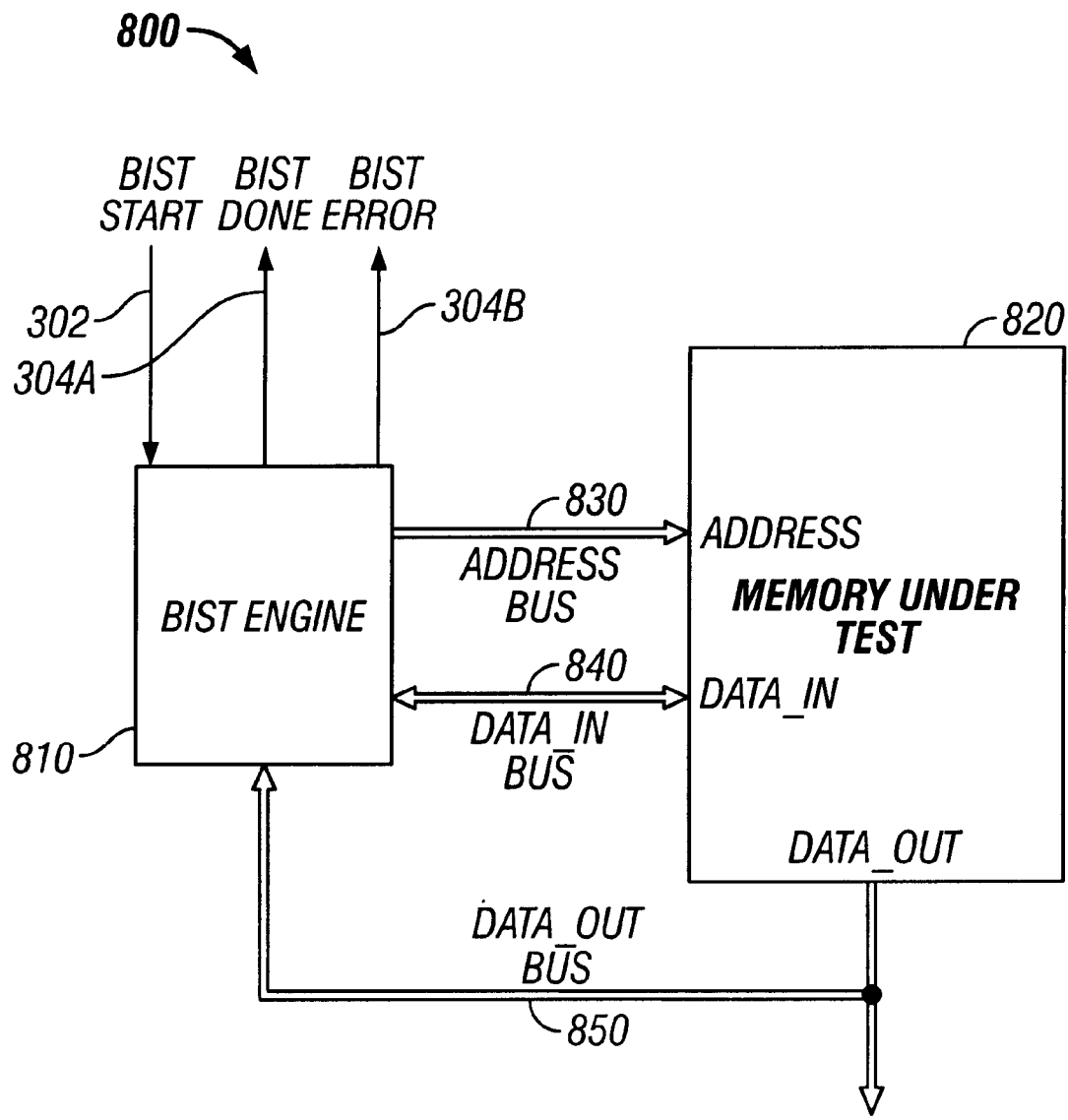
FIG. 8 is a block diagram illustrating a centralized BIST architecture.

FIG. 8 is a block diagram illustrating a centralized BIST architecture. As shown in FIG. 8, in a centralized BIST architecture, there is a single BIST engine 810 to test an entire memory under test 820, which is conceptually treated as a single memory array. As shown in FIG. 8 (and as described earlier with reference to FIG. 4), a BIST START signal 302 may be used to initialize BIST mode. When in BIST mode, BIST engine 810 generates addresses on address bus 830 and data on data input bus 840 to be routed to the memory under test, and the output data is routed from the memory under test to the BIST engine via output data bus 850. As will be described in more detail later with reference to FIG. 10, if the memory under test 200 is reconfigured and if a centralized BIST architecture is used, then the BIST engine 810 must be reconfigured to generate only addresses corresponding to the "good" half of the memory under test on address bus 830.

Figure 9:
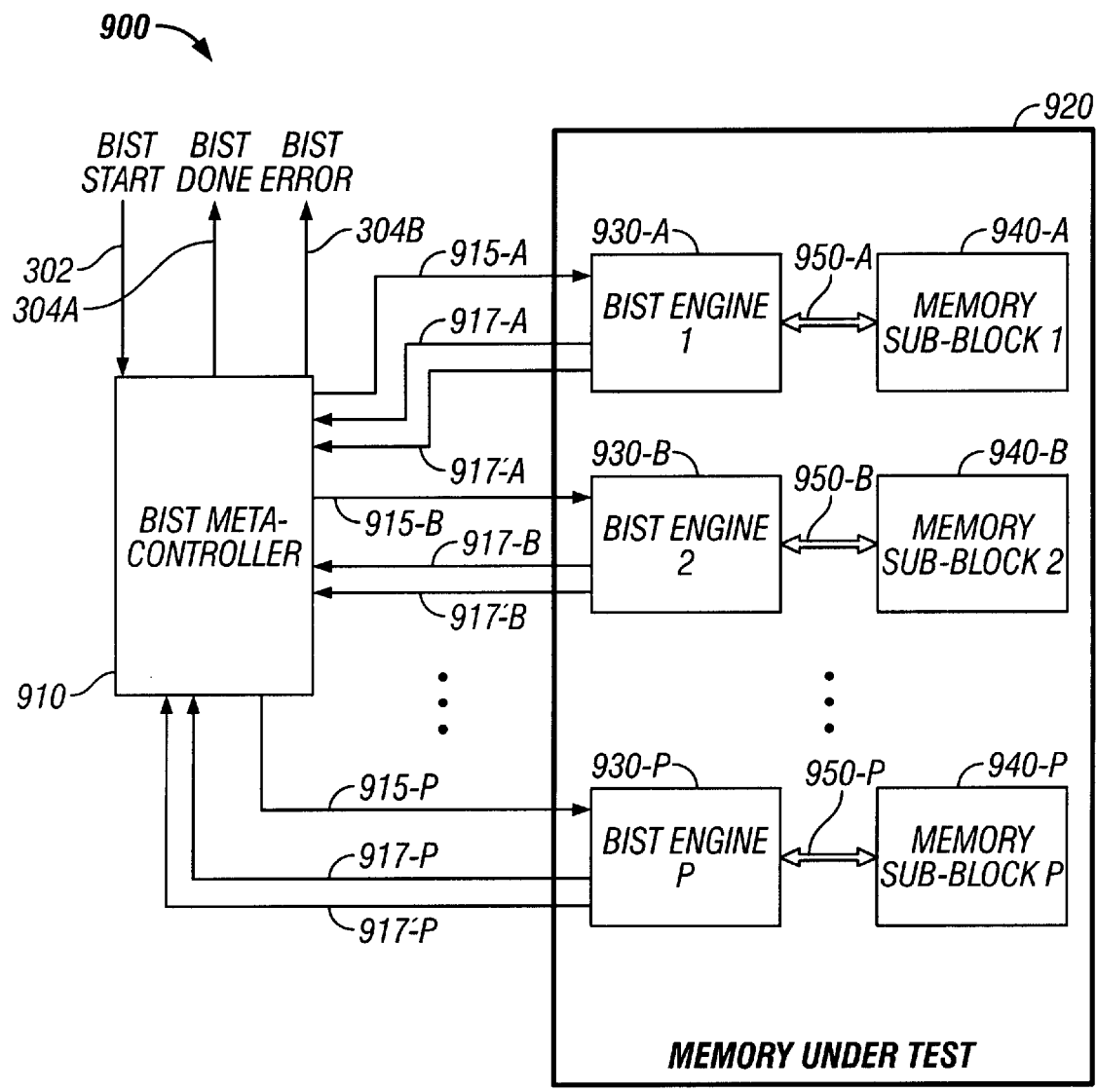
FIG. 9 is a block diagram illustrating a distributed BIST architecture.

FIG. 9 is a block diagram illustrating a distributed BIST architecture. As shown in FIG. 9, in a distributed BIST architecture, the memory under test 920 is subdivided into P sub-blocks 940-A–940-P. For example, a 512 KB memory array may be subdivided into 16 sub-blocks, each having a memory size of 32 KB. Each memory subblock 940-A–940-P is coupled to a corresponding distributed BIST engine 930-A–930P via a corresponding control bus 950-A–950-P. Each distributed BIST engine 930 is typically located in close physical proximity to its corresponding memory sub-block, generates test addresses and test input data via bus 950, and receives test output data also via bus 950. Thus, each distributed BIST engine 930 operates similarly to the centralized BIST engine 810 shown in FIG. 8, but only on a sub-block of the memory under test 920, as opposed to the entire memory.

In the distributed BIST architecture shown in FIG. 9, a centralized BIST meta-controller 910 interfaces with the various distributed BIST engines 930. The BIST meta-controller 910 receives a master BIST START signal 302, and reports the results of the BIST test via the BIST DONE 304-A or BIST ERROR signal 304-B. Typically, when in BIST mode, BIST meta-controller 910 would cycle through all of the distributed BIST engines sequentially, by commanding each distributed BIST engine 930 via its corresponding command line 915 to initiate a BIST test on the sub-block of memory assigned to that particular BIST engine 930, and would then wait to receive the results of this sub-test via the corresponding signal lines BIST DONE 917-A and BIST ERROR 917-A. After receiving the results of a sub-test from one of the distributed BIST engines 930, the BIST meta-controller 910 would then activate the next distributed BIST engine 930, until all of the distributed BIST engines are activated and all their results are collected. As will be described in more detail later with reference to FIG. 11, if the memory under test 920 is reconfigured and if a distributed BIST architecture is used, then the BIST meta-controller 910 must be reconfigured to disable the distributed BIST engines 930 corresponding to the "bad" half of the memory under test, and to ignore any test results reported by all such disabled distributed BIST engines 930.

Figure 10:
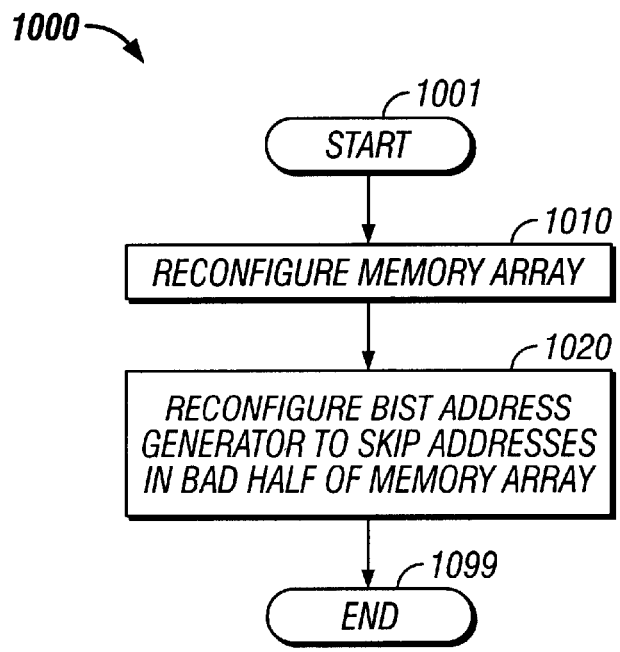
FIG. 10 is a flow chart illustrating a method for reconfiguring a centralized BIST architecture when the memory being tested is reconfigured.

FIG. 10 is a flow chart illustrating a method 1000 for reconfiguring a centralized BIST architecture when the memory being tested is reconfigured. As shown in FIG. 10, the process starts at step 1001, and at step 1010, the memory under test is reconfigured using any suitable technique known to those of ordinary skill in the art. At step 1020, the BIST controller is reconfigured such that its associated BIST address generator only generates addresses in the "good" half of the memory under test. The process then terminates at step 1099. Thus, in a centralized BIST architecture, the fuses that set address bit "M" in the memory device under test permanently to 1 (thereby reconfiguring the memory device), also sets the corresponding address bit of the address generator of the BIST engine to 1. This way, when the BIST finite state machine is performing the test algorithm, it never generates an address in the faulty half the cache.

Figure 11:
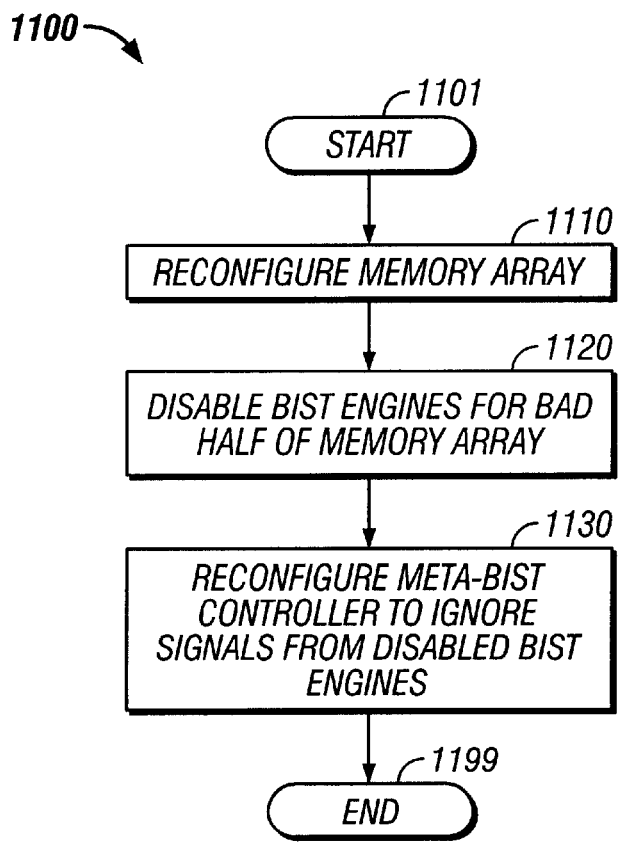
FIG. 11 is a flow chart illustrating a method for reconfiguring a distributed BIST architecture when the memory being tested is reconfigured.

FIG. 11 is a flow chart illustrating a method 1100 for reconfiguring a distributed BIST architecture when the memory being tested is reconfigured. As shown in FIG. 11, the process starts at step 1101, and at step 1110, the memory under test is reconfigured using any suitable technique known to those of ordinary skill in the art. At step 1120, the BIST meta-controller is reconfigured to disable all of the distributed BIST engines corresponding to the "bad" half of the memory under test. At step 1130, the BIST meta-controller is reconfigured to ignore all error signals reported from any of the disabled distributed BIST engines. The process then terminates at step 1199. Thus, in a distributed BIST architecture, the meta-controller sequences the BIST controllers of individual sub-blocks by sending an activation signal to them one after the other. In this case, the programmable fuse permanently disables the activation signals to the BIST controllers of sub-blocks in the faulty half of the cache.

Figure 12A:
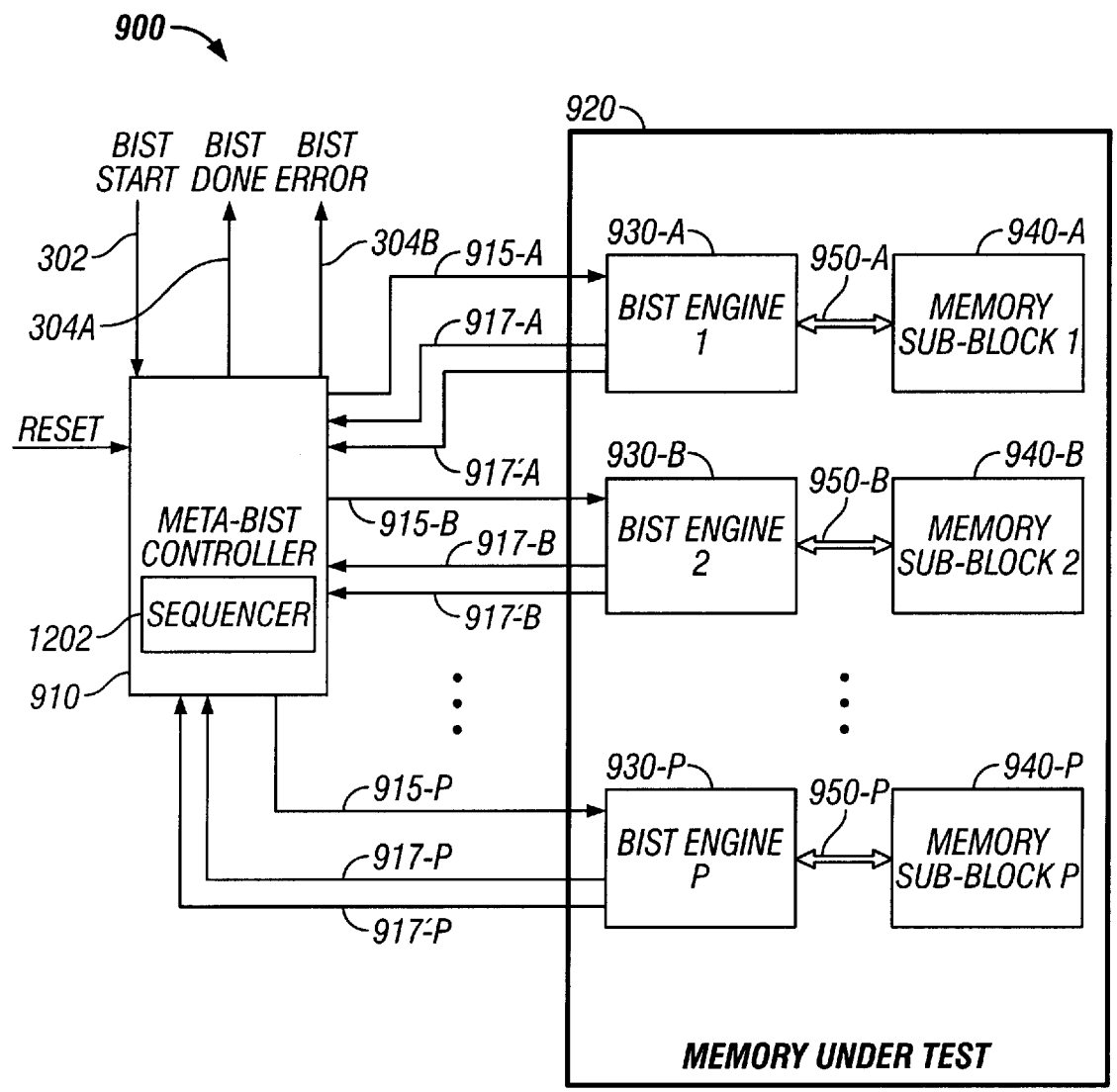
FIG. 12A is a generalized block diagram of a distributed BIST engine (i.e., a BIST meta-controller coupled to memory under test).

Turning now to FIG. 12A, a block diagram for a distributed BIST system is shown. The BIST meta-controller 910 is essentially a state machine that sequences through the BIST tests for each of the sub-blocks of the memory under test.

When the BIST start signal 302 is given, the meta-controller 910 starts the BIST for the full memory under test 920. It first sends a START BIST signal 915-A to the local BIST engine 930-A of a memory sub-block 1 940-A. When the local BIST engine 1 930-A receives the start signal, it runs the memory test algorithm on memory sub-block 1 940-A. Based on the result of the test, the local BIST engine 930-A sends a BIST DONE signal 917-A or a BIST ERROR signal 917'-A to the BIST meta-controller 910.

If the meta-controller receives a BIST ERROR signal, it signals a BIST ERROR signal 304-B indicating that the test failed and the memory under test is faulty. If the meta-controller receives a BIST DONE signal from local BIST engine 1, it moves onto testing the next memory sub-block by sending a BIST START signal 915-B to local BIST engine 2 930-B that controls the testing of memory sub-block 2. Thus the meta-controller sequences through all the memory sub-blocks testing each one until a BIST ERROR is detected in one of the sub-blocks or until all the blocks have send BIST DONE signals.

When the memory is reconfigured, some of the memory sub-blocks are made inaccessible in normal functional mode using a binary programmable element.

Figure 12B:
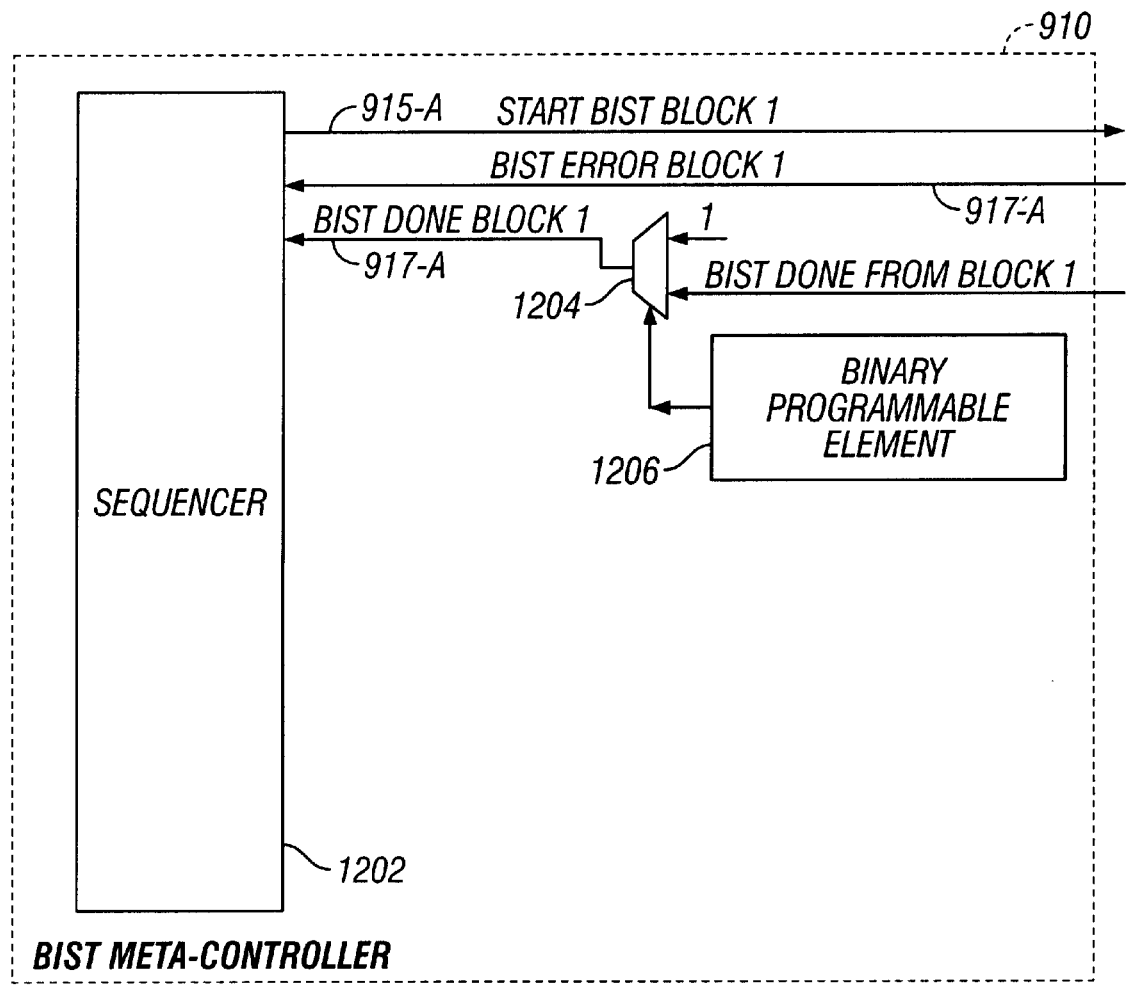
FIG. 12B is a generalized block diagram of a reconfigurable distributed BIST engine.

The meta-controller for a reconfigurable memory is shown in FIG. 12B. The working of the meta-controller is the same as the one in FIG. 12A, except that each BIST DONE signal from each memory sub-block is multiplexed with a "1" before sending it to the meta-controller. The input of the multiplexer is selected based on the value of the binary programmable element 1206. For the original full-size memory, the value of the programmable element is such that the BIST DONE signal from the sub-block goes to the meta-controller. When the memory is reconfigured, if a particular memory sub-block is inaccessible, the binary programmable element corresponding to that sub-block is programmed such that the BIST DONE signal from the sub-block 917-A is always "1", indicating that the BIST test for that block is already done. This is done for all sub-blocks that are not a part of the reconfigured memory.

Now the reconfigured BIST engine, when sequencing through all the blocks, can check to see which of the sub-blocks are sending a "1" as BIST done signal and it can avoid sending the BIST start signal to those sub-blocks. Thus, effectively, the BIST engine does not test those memory sub-blocks that are not a part of the reconfigured memory.

Figure 13A:
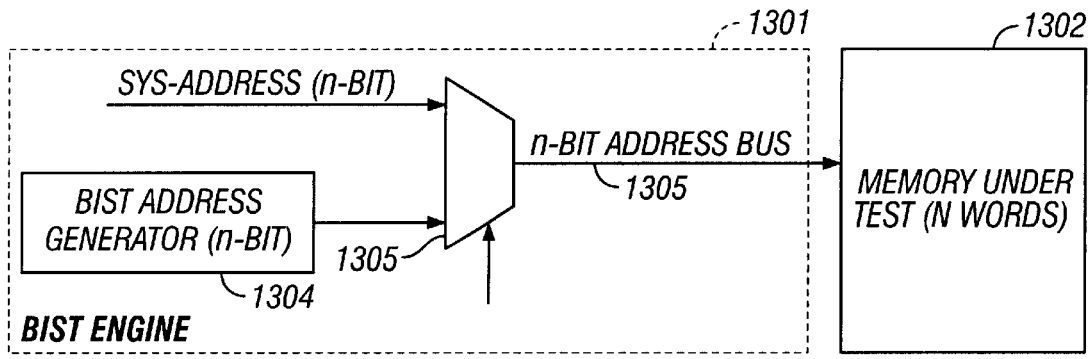
FIG. 13A is a generalized block diagram illustrating a centralized BIST engine for a full memory.
Figure 13B:
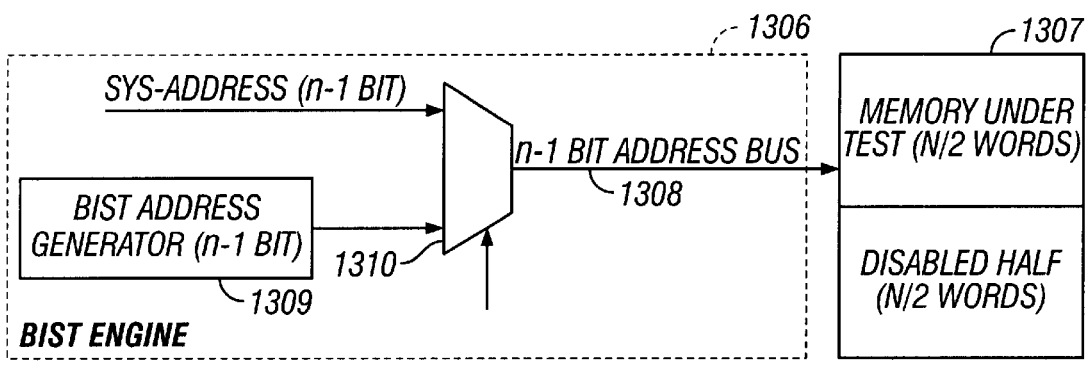
FIG. 13B is a generalized block diagram illustrating the change required in a centralized BIST engine for testing one-half of the memory.

Turning now to FIGS. 13A and 13B, a system for centralized BIST is shown in block diagram form. In the case of centralized BIST engine 1301 for a N-word memory under test 1302 in FIG. 13A, an address generator 1304 generates all the address values of the memory for reading and writing data. The address generator could either be 1) an up-down counter that generates addresses in an increasing or a decreasing order, or a 2) linear feedback shift register (LFSR) that generates the addresses in a pseudo-random sequence. If the memory has N words, than an n-bit address generator 1304 is required to test the full memory, where $2^n=N$.

When such memory is reconfigured to half it's size (N/2 words) 1307 in FIG. 13B, then a smaller address space needs to be accessed during BIST. If this smaller memory is to be tested using a BIST engine, an (n−1)-bit address generator 1309 would be required. The (n−1) bit address generator 1309 would then generate addresses corresponding to the "good" half of the memory under test 1307.

This specific embodiment of the present invention pertains to the design of a BIST engine that can be reconfigured from the one shown in FIG. 13A to the one shown in FIG. 13B, when the memory under test is reconfigured.

Figure 14:
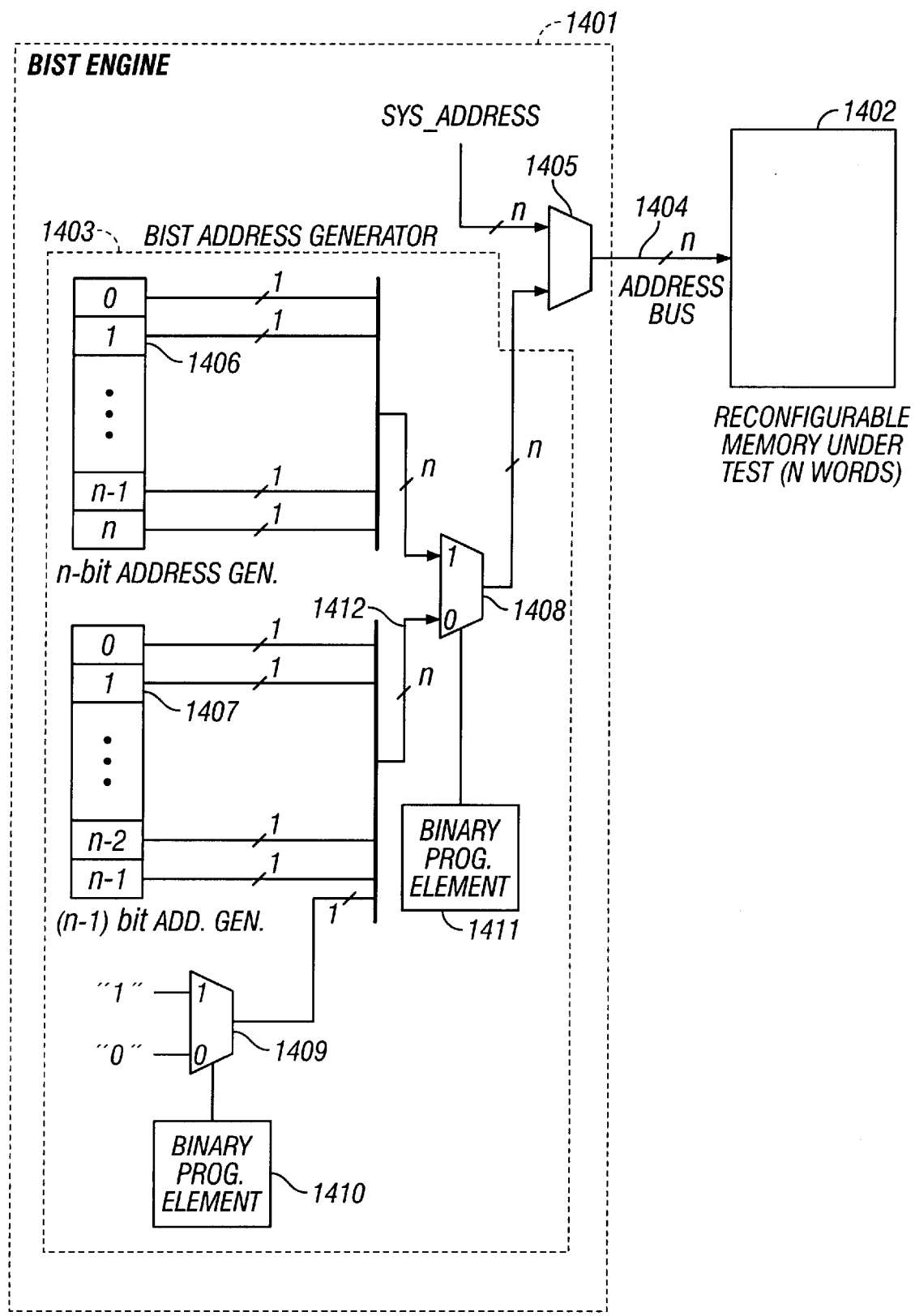
FIG. 14 is a block diagram of a reconfigurable centralized BIST engine in accordance with a specific embodiment of the present invention.

FIG. 14 depicts the most general way of designing a centralized BIST engine 1401 with a reconfigurable address generator 1403. Only the address generation part of the BIST engine is depicted for clarity.

Muliplexer 1405 chooses between SYS ADDRESS during normal operation and BIST address during BIST operation. The BIST address generation circuitry (counter or LFSR) is duplicated in this reconfigurable BIST engine design. The n-bit address generator 1406 generates all $2^n=N$ addresses and is used when the full N-word memory 1402 is enabled and used in the chip. The full N-word memory address generation during BIST is selected by the appropriate value on the select line of the multiplexer 1408. The binary programmable element is such that it selects the address generator 1406 by default, but can be programmed and reconfigured, if needed to select the other BIST address path.

The other BIST address path comes form a (n−1) bit address generator 1407. The single bit of the address space that determines which "half" of the memory is disabled during reconfiguration comes from the mulitplexer 1409. For example, this bit could be bit 19 (MSB) in FIG. 2. Depending on whether the "left" half or the "right" half of the memory is disabled during reconfiguration, the binary programmable element 1410 is programmed to select "1" or "0" appropriately. This single bit and the (n−1) bits from the address generators 1407 form the address bus 1412 for the reconfigured memory. Note that the value of the binary programmable elements 1411 and 1410 need not be the same for a reconfigured BIST engine.

The scheme depicted in FIG. 14 is the most general scheme that used duplication of circuitry. Very optimized address generators can be designed, where the (n−1) state elements of 1407 are a subset of the n state elements of 1406. Any logic synthesis CAD tool or a design complier can generate many such optimized designs, given the behavioral description of FIG. 14. This invention covers all such possible logic implementations that fall under the general architectural scheme depicted in FIG. 14.

In one embodiment, a reconfigurable BIST engine according to aspects of the present invention is useful for testing the 512 KB cache version as well as the 256 KB cache version of a microprocessor without having to make any changes to the BIST engine design.

While embodiments and applications of this invention have been shown and described, it would be apparent to those of ordinary skill in the art having the benefit of this disclosure that many more modifications than mentioned above are possible without departing from the inventive concepts herein. The invention, therefore, is not to be restricted except in the spirit of the appended claims.

What is claimed is:

1. A method for reconfiguring a built-in self-test ("BIST") engine for testing a reconfigurable memory on an integrated circuit, comprising:
   executing a first BIST test on said reconfigurable memory using said BIST engine, the reconfigurable memory having a first memory space;
   reconfiguring said reconfigurable memory, the reconfigured memory having a second memory space smaller than the first memory space;
   reconfiguring said BIST engine for the second memory space; and
   executing a second BIST test on said reconfigured memory using said reconfigured BIST engine.

2. The method according to claim 1, wherein said memory is an embedded memory.

3. The method according to claim 1, wherein said BIST engine is also on said integrated circuit.

4. The method according to claim 1, wherein said memory is an embedded memory and said BIST engine is also on said integrated circuit.

5. The method according to claim 1, wherein said memory is an L2 cache memory.

6. The method according to claim 5, wherein said BIST engine is also on said integrated circuit.

7. The method according to claim 6, wherein said memory is an L2 cache memory and said BIST engine is also on said integrated circuit.

8. The method according to claim 1 wherein said memory is an SRAM.

9. The method according to claim 1 wherein said memory is a DRAM.

10. The method according to claim 1 wherein said memory is a flash memory.

11. The method according to claim 1 wherein said memory is a ROM.

12. The method according to claim 1 wherein said memory is a blockbased memory consisting of repeating cells or blocks, wherein said BIST engine is also on said integrated circuit.

13. The method of claim 1, wherein said reconfiguration of said memory comprises deactivating one half of the first memory space.

14. The method of claim 13, wherein said BIST engine is a centralized BIST engine.

15. The method of claim 14 wherein said BIST engine reconfiguration comprises preventing said BIST engine from generating addresses corresponding to said deactivated half of said first memory space.

16. The method of claim 13, wherein said BIST engine is a distributed BIST engine.

17. The method of claim 16, wherein said BIST engine is a distributed BIST engine, wherein said BIST engine reconfiguration comprises deactivating distributed sub-BIST engines corresponding to said deactivated half of said first memory space and ignoring error signals generated by said deactivated distributed sub-BIST engines.

18. An apparatus for reconfiguring a built-in self test ("BIST") engine for testing a reconfigurable memory on an integrated circuit, comprising:
   means for executing a first BIST test on said reconfigurable memory using said BIST engine, the reconfigurable memory having a first memory space;
   means for reconfiguring said reconfigurable memory, the reconfigured memory having a second memory space smaller than the first memory space;
   means for reconfiguring said BIST engine for the second memory space; and
   means for executing a second BIST test on said reconfigured memory using said reconfigured BIST engine.

19. The apparatus according to claim 18, wherein said memory is an embedded memory.

20. The apparatus according to claim 18, wherein said BIST engine is also on said integrated circuit.

21. The apparatus according to claim 18, wherein said memory is an embedded memory and said BIST engine is also on said integrated circuit.

22. The apparatus according to claim 18, wherein said memory is an L2-cache memory.

23. The apparatus according to claim 22, wherein said BIST engine is also on said integrated circuit.

24. The apparatus according to claim 23, wherein said memory is an L2-cache memory and said BIST engine is also on said integrated circuit.

25. The apparatus according to claim 18 wherein said memory is an SRAM.

26. The apparatus according to claim 18 wherein said memory is a DRAM.

27. The apparatus according to claim 18 wherein said memory is a flash memory.

28. The apparatus according to claim 18 wherein said memory is a ROM.

29. The apparatus according to claim 18 wherein said memory is a block-based memory consisting of repeating cells or blocks, wherein said BIST engine is also on said integrated circuit.

30. The apparatus of claim 18, wherein said means for reconfiguring said memory comprises means for deactivating one half of the first memory space.

31. The apparatus of claim 30, wherein said BIST engine is a centralized BIST engine.

32. The apparatus of claim 31 wherein said means for reconfiguring said BIST engine comprises means for preventing said BIST engine from generating addresses corresponding to said deactivated half of said first memory space.

33. The apparatus of claim 30, wherein said BIST engine is a distributed BIST engine.

34. The apparatus of claim 33, wherein said BIST engine is a distributed BIST engine, and wherein said means for reconfiguring said BIST engine comprises means for deactivating distributed sub-BIST engines corresponding to said deactivated half of said first memory space and for ignoring error signals generated by said deactivated distributed sub-BIST engines.

35. An apparatus for reconfiguring a built-in self test ("BIST") engine for testing a reconfigurable memory on an integrated circuit, comprising:
    a BIST engine for testing said reconfigurable memory;
    a first set of one or more fuses for reconfiguring said reconfigurable memory; and
    a second set of one or more fuses for reconfiguring said BIST engine for testing said reconfigured memory.

36. The apparatus according to claim 35, wherein said memory is an embedded memory.

37. The apparatus according to claim 36, wherein said BIST engine is also on said integrated circuit.

38. The apparatus according to claim 37, wherein said memory is an embedded memory and said BIST engine is also on said integrated circuit.

39. The apparatus of claim 37, wherein said BIST engine is a centralized BIST engine.

40. The apparatus of claim 37, wherein said BIST engine is a centralized BIST engine, wherein said memory is reconfigured by deactivating one half of the address space of said memory, and wherein said BIST engine is reconfigured by preventing said BIST engine from generating addresses corresponding to said deactivated half of said address space of said memory.

41. The apparatus of claim 37, wherein said BIST engine is a distributed BIST engine.

42. The apparatus of claim 37, wherein said BIST engine is a distributed BIST engine, wherein said memory is reconfigured by deactivating one half of the address space of said memory, and wherein said BIST engine is reconfigured by deactivating distributed sub-BIST engines corresponding to said deactivated half of said address space of said memory and by modifying said BIST engine to ignore error signals generated by said deactivated distributed sub-BIST engines.

43. The apparatus according to claim 35, wherein said memory is an L2-cache memory.

44. The apparatus according to claim 43, wherein said BIST engine is also on said integrated circuit.

45. The apparatus according to claim 44, wherein said memory is an L2-cache memory and said BIST engine is also on said integrated circuit.

46. The apparatus according to claim 35 wherein said memory is an SRAM.

47. The apparatus according to claim 35 wherein said memory is a DRAM.

48. The apparatus according to claim 35 wherein said memory is a flash memory.

49. The apparatus according to claim 35 wherein said memory is a ROM.

50. The apparatus according to claim 35 wherein said memory is a block-based memory consisting of repeating cells or blocks, wherein said memory is reconfigurable, and wherein said BIST engine is also on said integrated circuit.

51. The apparatus of claim 35, wherein said fuses are laser fuses.

52. The apparatus of claim 35, wherein said fuses are e-fuses.

53. The apparatus of claim 35, wherein said fuses are software programmable fuses.

54. The apparatus of claim 35, wherein said first set of one or more fuses and said second set of fuses are the same set of one or more fuses.

55. A method for reconfiguring a built-in self-test ("BIST") engine for testing a reconfigurable memory on an integrated circuit, said method comprising:
    executing a first BIST test on the reconfigurable memory using the BIST engine, the reconfigurable memory having a first memory space;
    repairing the reconfigurable memory based on the first BIST test if the reconfigurable memory is repairable;
    reconfiguring the reconfigurable memory based on the first BIST test if the reconfigurable memory is not repairable, the reconfigured memory having a second memory space smaller than the first memory space;
    reconfiguring the BIST engine for the second memory space; and
    executing a second BIST test on said reconfigured memory using said reconfigured BIST engine.

56. The method according to claim 55 wherein said reconfiguring the reconfigurable memory includes:
    deactivating one half of the first memory space.

57. The method according to claim 56 wherein said BIST engine is a centralized BIST engine.

58. The method according to claim 57 wherein said reconfiguring the BIST engine includes:
    preventing the BIST engine from generating addresses corresponding to said deactivated half of said first memory space.

59. The method according to claim 58 wherein said reconfiguring the BIST engine includes:
    deactivating the sub-BIST engines corresponding-to the deactivated half of said first memory space.

60. The method according to claim 58 wherein said distributed BIST engine further includes a BIST controller controlling the plurality of sub-BIST engines.

61. The method according to claim 56 wherein said BIST engine is a distributed BIST engine including a plurality of sub-BIST engines.

62. The method according to claim 61 wherein said reconfiguring the BIST engine further includes:
    reconfiguring the BIST controller so as to ignore signals generated by the deactivated sub-BIST engines.

63. The method according to claim 55, wherein said reconfigurable memory is an L2-cache memory.

64. An apparatus for reconfiguring a built-in self-test ("BIST") engine for testing a reconfigurable memory on an integrated circuit, said apparatus comprising:
    means for executing a first BIST test on the reconfigurable memory using the BIST engine, the reconfigurable memory having a first memory space;
    means for repairing the reconfigurable memory based on the first BIST test if the reconfigurable memory is repairable;
    means for reconfiguring the reconfigurable memory based on the first BIST test if the reconfigurable memory is not repairable, the reconfigured memory having a second memory space smaller than the first memory space;
    means for reconfiguring the BIST engine for the second memory space; and means for executing a second BIST test on said reconfigured memory using said reconfigured BIST engine.

65. The apparatus according to claim 64 wherein said means for reconfiguring the reconfigurable memory includes:

means for deactivating one half of the first memory space.

66. The apparatus according to claim 65 wherein said BIST engine is a centralized BIST engine.

67. The apparatus according to claim 66 wherein said means for reconfiguring the BIST engine includes:

means for preventing the BIST engine from generating addresses corresponding to said deactivated half of said first memory space.

68. The apparatus according to claim 65 wherein said BIST engine is a distributed BIST engine including a plurality of sub-BIST engines.

69. The apparatus according to claim 68 wherein said means for reconfiguring the BIST engine includes:

means for deactivating the sub-BIST engines corresponding to the deactivated half of said first memory space.

70. The apparatus according to claim 69 wherein said distributed BIST engine further includes a BIST controller controlling the plurality of sub-BIST engines.

71. The apparatus according to claim 70 wherein said means for reconfiguring the BIST engine further includes:

means for reconfiguring the BIST controller so as to ignore signals generated by the deactivated sub-BIST engines.

72. The apparatus according to claim 64, wherein said reconfigurable memory is an L2-cache memory.

73. A program storage device readable by a machine, tangibly embodying a program of instructions executable by the machine to perform a method for reconfiguring a built-in self-test ("BIST") engine for testing a reconfigurable memory on an integrated circuit, said method comprising:

executing a first BIST test on the reconfigurable memory using the BIST engine, the reconfigurable memory having a first memory space;

repairing the reconfigurable memory based on the first BIST test if the reconfigurable memory is repairable;

reconfiguring the reconfigurable memory based on the first BIST test if the reconfigurable memory is not repairable, the reconfigured memory having a second memory space smaller than the first memory space;

reconfiguring the BIST engine for the second memory space; and executing a second BIST test on said reconfigured memory using said reconfigured BIST engine.

74. A program storage device readable by a machine, tangibly embodying a program of instructions executable by the machine to perform a method for reconfiguring a built-in self-test ("BIST") engine for testing a reconfigurable memory on an integrated circuit, said method comprising:

executing a first BIST test on said reconfigurable memory using said BIST engine, the reconfigurable memory having a first memory space;

reconfiguring said reconfigurable memory, the reconfigured memory having a second memory space smaller than the first memory space;

reconfiguring said BIST engine for the second memory space; and executing a second BIST test on said reconfigured memory using said reconfigured BIST engine.

\* \* \* \* \*